(12) United States Patent
Veglia et al.

(10) Patent No.: US 11,221,384 B2
(45) Date of Patent: Jan. 11, 2022

(54) SYSTEM AND METHOD FOR PRODUCING RADIOFREQUENCY PULSES IN MAGNETIC RESONANCE USING AN OPTIMAL PHASE SURFACE

(71) Applicant: REGENTS OF THE UNIVERSITY OF MINNESOTA, Minneapolis, MN (US)

(72) Inventors: Gianluigi Veglia, Minneapolis, MN (US); Manu Veliparambil Subrahmanian, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 36 days.

(21) Appl. No.: 16/861,506

(22) Filed: Apr. 29, 2020

(65) Prior Publication Data

US 2020/0341084 A1 Oct. 29, 2020

Related U.S. Application Data

(60) Provisional application No. 62/840,004, filed on Apr. 29, 2019.

(51) Int. Cl.
*G01V 3/00* (2006.01)
*G01R 33/36* (2006.01)
*G06N 3/12* (2006.01)
*G01R 33/54* (2006.01)
*G01R 33/46* (2006.01)

(52) U.S. Cl.
CPC ..... *G01R 33/3607* (2013.01); *G01R 33/4616* (2013.01); *G01R 33/543* (2013.01); *G06N 3/126* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

*Primary Examiner* — Walter L Lindsay, Jr.
*Assistant Examiner* — Frederick Wenderoth
(74) *Attorney, Agent, or Firm* — Quarles & Brady LLP

(57) ABSTRACT

The present disclosure provides a method for producing a radio frequency (RF) pulse for use in magnetic resonance. The steps of the method include providing a computer system and a set of RF input parameters. The computer system then generates an optimal phase surface by iteratively updating an initial RF pulse profile based at least in part on the set of RF input parameters. The optimal phase surface contains a set of iteratively generated RF pulse profiles with various characteristics, such as bandwidths or selectivity. The steps of the method further include selecting an RF pulse profile with the computer system based on a search on the optimal phase surface, which can be implemented with the help of an index file. The search can be performed using an artificial intelligence algorithm, and can retrieve the shortest pulse profile that satisfies user input parameters or requirements.

30 Claims, 32 Drawing Sheets
(25 of 32 Drawing Sheet(s) Filed in Color)

User Inputs:
OperationType = 'pix';
PulseLength90_us = 10;
Required_BW_kHz = 50;
Required_RFcomp_per = 5;
MinimumFidelityRequired = 99;

pix → for π pulse with phase x
z2iz → for inversion pulse

*Time Taken*
< 1 Sec for generating Bruker Shape file
~ 6 Seconds for Simulation outputs.

OutPut: Pulse time : *143.366* μs

Generated Bruker Shape file simulated using Bruker Topspin Simulation:

User Inputs :

| | | |
|---|---|---|
| OperationType | = 'pix'; | pix → for π pulse with phase x |
| PulseLength90_us | = 10; | z2iz → for inversion pulse |
| Required_BW_kHz | = 50; | |
| Required_RFcomp_per | = 10; | *Time Taken* |
| MinimumFidelityRequired | = 99; | < 1 Sec for generating Bruker Shape file |
| | | ~ 6 Seconds for Simulation outputs. |

OutPut: Pulse time : *185.574* μs

Generated Bruker Shape file simulated using Bruker Topspin Simulation:

User Inputs:
OperationType = 'z2iz';
PulseLength90_us = 10;
Required_BW_kHz = 10;
Required_RFcomp_per = 5;
MinimumFidelityRequired = 99;

pix → for π pulse with phase x
z2iz → for inversion pulse

*Time Taken*
< 1 Sec for generating Bruker Shape file
~ 6 Seconds for Simulation outputs.

OutPut: Pulse time : 43.672 μs

Generated Bruker Shape file simulated using Bruker Topspin Simulation:

User Inputs :

| | | |
|---|---|---|
| OperationType | = 'z2iz'; | pix → for π pulse with phase x |
| PulseLength90_us | = 10; | z2iz → for inversion pulse |
| Required_BW_kHz | = 50; | |
| Required_RFcomp_per | = 10; | *Time Taken* |
| MinimumFidelityRequired | = 99; | *< 1 Sec for generating Bruker Shape file* |
| | | *~ 6 Seconds for Simulation outputs.* |

OutPut: Pulse time : *108.989* µs

Generated Bruker Shape file simulated using Bruker Topspin Simulation:

User Inputs:

| | |
|---|---|
| OperationType | = 'piby2x'; |
| PulseLength90_us | = 10; |
| Required_BW_kHz | = 40; |
| Required_RFcomp_per | = 10; |
| MinimumFidelityRequired | = 99; | piby2x → for π/2 pulse with phase x
z2y → for excitation pulse

*Time Taken*
< 1 Sec for generating Bruker Shape file
~ 6 Seconds for Simulation outputs.

OutPut: Pulse time : 125.9 μs

Generated Bruker Shape file simulated using Bruker Topspin Simulation:

User Inputs :

| | | |
|---|---|---|
| OperationType | = 'piby2x'; | piby2x → for π/2 pulse with phase x |
| PulseLength90_us | = 10; | z2y → for excitation pulse |
| Required_BW_kHz | = 80; | |
| Required_RFcomp_per | = 10; | *Time Taken* |
| MinimumFidelityRequired | = 99; | < 1 Sec for generating Bruker Shape file |
| | | ~ 6 Seconds for Simulation outputs. |

OutPut: Pulse time : *227.7* µs

Generated Bruker Shape file simulated using Bruker Topspin Simulation:

SYSTEM AND METHOD FOR PRODUCING RADIOFREQUENCY PULSES IN MAGNETIC RESONANCE USING AN OPTIMAL PHASE SURFACE

CROSS-REFERENCE TO RELATED APPLICATIONS

This application claims the benefit of U.S. Provisional Patent Application Ser. No. 62/840,004, filed on Apr. 29, 2019, and entitled "SYSTEM AND METHOD FOR PRODUCING RADIOFREQUENCY PULSES IN MAGNETIC RESONANCE USING AN OPTIMAL PHASE SURFACE," which is herein incorporated by reference in its entirety.

STATEMENT REGARDING FEDERALLY SPONSORED RESEARCH

This invention was made with government support under GM064742 and GM100310 awarded by National Institutes of Health. The government has certain rights in the invention.

BACKGROUND

One of the most important tools in magnetic resonance experiments is the ability to selectively control and manipulate nuclear magnetization with RF pulses. RF pulses provide selectivity in Larmor frequency, and can manipulate the spin-spin interactions. Currently, RF pulses are created a priori and optimize both amplitude and duration to match the desired experimental bandwidth and excitation profile.

For example, the standard practice of designing RF pulses is to start with a desired bandwidth and select the predefined shapes from a library by modifying the amplitude and duration by assuming idealized conditions or by making several approximations. One of the most common RF pulse designs in MRI is the small flip-angle, where magnetization is tipped down from equilibrium to the transverse plane by a small angle of (<30°). In the instance where there is a constant gradient, the RF excitation waveform can be approximated by the inverse Fourier Transform of the desired frequency profile using a linear excitation k space analysis. These approximations work poorly for large flip angles and spin echo pulses. Several alternative methods have been proposed for large flip angles, including Bloch equation approximations, numerical simulators, and control theory methods. One method in particular is the Shinnar-Le Roux (SLR) pulse design. The SLR method simplifies the Bloch equations to the design of two polynomials, which can be solved using digital filter design algorithms. Each of these methods relies on making assumptions to simplify the design of RF pulses into a practical matter. However, hardware limitations often reduce the performance of these pulse sequences, and often jeopardize the outcome of these experiments. Furthermore, arbitrary RF target patterns cannot be solved under these idealized methods.

Currently, there is a need for a new approach that enables one to design an RF pulse without pre-determined shapes to improve performance in magnetic resonance experiments, and to allow RF pulses to be designed for user-specific problems.

SUMMARY OF THE DISCLOSURE

The present disclosure overcomes the aforementioned drawbacks by providing a bottom-up approach for producing RF pulses for application to solution-state and solid-state NMR as well as imaging (MRI) experiments. Unlike previous designs of RF pulses that are confined to pre-determined shapes, the present disclosure provides a method of designing RF pulses without pre-determined pulse shapes. The RF pulses may be tailored to user-specific problems, improving the performance of magnetic resonance experiments in terms of bandwidth, power, and boosting the signal-to-noise ratio.

In some aspects, the present disclosure provides a method for producing a RF pulse for use in magnetic resonance. The method includes providing a set of RF input parameters to a computer system and generating an optimal phase surface with the computer system by iteratively updating an initial RF pulse profile based at least in part on the set of RF input parameters. The optimal phase surface contains a different RF pulse profile for each RF input parameter in the set of RF input parameters. The method also includes selecting an RF pulse profile from the optimal phase surface with the computer system based on a selection of an RF input parameter in the set of RF input parameters associated with a desired characteristic of the RF pulse profile.

In other aspects, the present disclosure provides a method for producing an RF pulse for use in magnetic resonance. A set of RF input parameters are provided to a computer system. A neural network is accessed by the computer system, where the neural network has been trained on training data that include optimal phase surface data containing different RF pulse profiles for RF input parameters. The neural network is trained to generate RF pulse profile data based on input RF pulse parameter data. One or more RF input parameters are selected from the set of RF input parameters associated with a desired characteristic of an RF pulse profile. The one or more RF input parameters are input to the neural network, generating output as the RF pulse profile.

In still other aspects, the present disclosure provides a method for producing a RF pulse for use in a nuclear magnetic resonance system. The method includes providing a set of RF input parameters to a computer system and generating an optimal phase surface with the computer system by iteratively updating an initial RF pulse profile based at least in part on the set of RF input parameters. The optimal phase surface contains a different RF pulse profile for each RF input parameter in the set of RF input parameters. The method also includes providing an index file to the computer system. The index file contains an indexing of data in the optimal phase surface. An RF pulse profile is selected from the optimal phase surface with the computer system based on a search on the optimal phase surface using the index file.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 14A shows band selective excitation, FIG. 14B shows band selective inversion, FIG. 14C shows a multi-band, multi-operation pulse with x magnetization on negative offset and y magnetization on positive offset, and FIG. 14D shows a multi band-multi operation pulse with x magnetization on negative and −x magnetization on positive offset. In these simulations, the initial magnetization was assumed to be along the z-direction.

FIG. 17B shows corresponding experiments repeated with ULP-$\pi$ pulses. The experiments were performed using a peptide sample on a 600 MHz Bruker NEO spectrometer (ns=8, ds=8; d1=5 sec).

FIG. 23A shows a $^{13}$C-labelled chloroform. FIG. 23B shows an entangling pulse sequence with J-compensation. The compensation level changes with n, as shown in FIG. 24. FIG. 23C shows a quantum state tomography after creating a |00⟩ pseudopure state. FIG. 23D shows the fidelity volume of a robust entangler (black surface) with experimental imperfections on J-coupling, RF field strength, and offset for the n=2 case. The red surface shows the fidelity volume of the entangler with hard pulses.

DETAILED DESCRIPTION OF THE INVENTION

Figure 1:
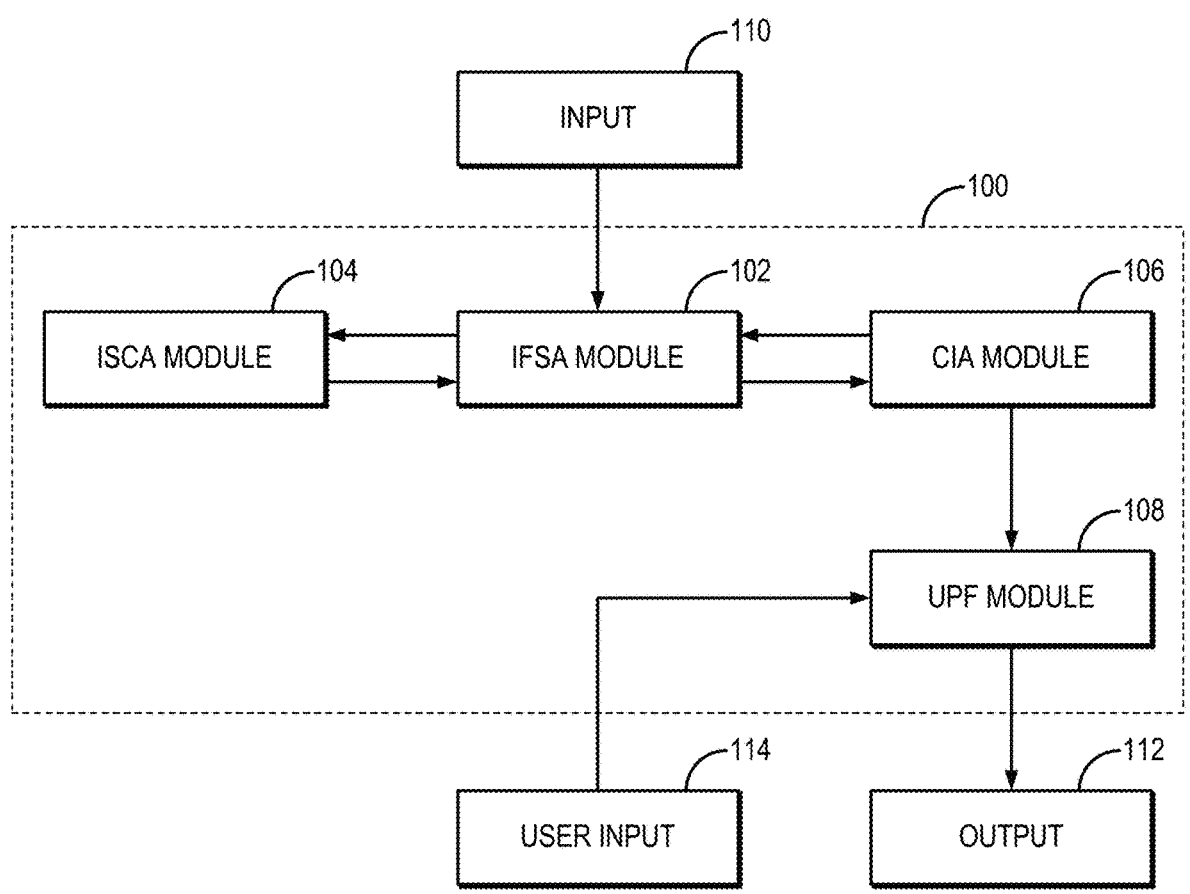
FIG. 1 is a flow diagram illustrating an example of a GENErator of Triply Compensated pulSes ("GENETICS") algorithm composed of an Iterative Forward Search Algorithm ("IFSA") module, an Iterative Self Correction Algorithm ("ISCA") module, a Contour Indexing Algorithm ("CIA") module, and a User Pulse Fetcher ("UPF") module, each implemented with a hardware processor and a memory.

Described herein are systems and methods that relate to a bottom-up approach for producing RF pulses for use in magnetic resonance experiments, such as nuclear magnetic resonance ("NMR") experiments and magnetic resonance imaging ("MRI"). As will be described below, the methods allow for the design of one or more optimized RF pulses that may be tailored to individual experiments. The RF pulses of the present disclosure may improve experimental performance by optimizing the RF pulse profile based on a set of user-specified RF input parameters to increase signal-to-noise ratio ("SNR") and to optimize experimental parameters such as bandwidth, power, and pulse length.

The methods described in the present disclosure enable the creation of RF pulses with triple compensation at a high level of fidelity. To this end, the methods may be referred to as GENETICS (GENErator of Triply Compensated pulSes).

The methods described in the present disclosure can be implemented with a hardware processor and a memory. In some embodiments, the methods can be carried out using software that implements four different modules: an Iterative Forward Search Algorithm ("IFSA"), an Iterative Self Correction Algorithm ("ISCA"), a Contour Indexing Algorithm ("CIA"), and a User Pulse Fetcher ("UPF").

The IFSA and ISCA modules work synergistically. Starting from a known problem-solution set, the IFSA and ISCA modules iteratively evolve an initial solution into a set of optimal solutions under control of a self-correction algorithm. Then, the CIA module analyzes the data generated. Under the control of a user interface, the UPF module retrieves the desired pulse shapes.

Unlike previous algorithms, the GENETICS algorithms described in the present disclosure generate triply-compensated RF pulses encoded with compensation for RF inhomogeneity, experimental calibration errors, and zz-type coupling interactions (i.e., weak J-coupling or heteronuclear dipolar couplings). The methods described in the present disclosure generate RF pulses suitable for several magnetic resonance spectroscopies, including high-resolution liquid-state NMR, solid-state NMR, MRI, electron paramagnetic resonance ("EPR"), and unilateral NMR.

The methods described in the present disclosure provide a number of advantages over previous numerical or analytical methods for generating RF pulses. As noted above, one advantage is that the methods described in the present disclosure generate RF pulses that are triply-compensated, including compensation for zz-type coupling interactions during pulse execution.

As another advantage, using the methods described in the present disclosure the bandwidths and RF compensation levels are customizable, making it possible to create pulses for various spectroscopies such as NMR, MRI, EPR, unilateral NMR. The methods described in the present disclosure also provide very high fidelity (e.g., greater than 99.9 percent) for pulse execution, which enables homogeneous excitation, inversion, or both, at high and ultra-high magnetic fields (greater than 900 MHz).

As another advantage, using the methods described in the present disclosure RF pulses can be generated that are significantly shorter at comparable bandwidth that RF pulses generated with previous methods. The methods described in the present disclosure can also be used to generate low digitization pulse shapes, resulting in significantly shorter pulses with respect to RF pulses designed with previous methods. For instance, RF pulses having less than 100 points per shaped pulse can be designed using the methods described in the present disclosure.

In some implementations, the methods described in the present disclosure utilize constant amplitude pulses, which can reduce amplitude switching errors.

The methods described in the present disclosure can provide an improvement to computation efficiency by enabling the faster design of RF pulses. In the implementations using CIA, RF pulses can be generated in less than 5 seconds. In the implementations using PhaseNET, RF pulses can be generated in as little as a few milliseconds.

As another advantage, the methods described in the present disclosure are highly versatile, and can be used to generate specialized RF pulses for applications in solvent suppression, selective pulses, simultaneous band selection, simultaneous band inversion, gradient shape design, and so on. In these instances, the RF pulses can be generated with high operational fidelity. The RF pulses can also be output to be compatible with a wide variety of different systems and manufacturer-specific specifications.

In some implementations, the methods described in the present disclosure can also provide a simple and user-friendly process for designing RF pulses for unique applications. For instance, the UPF module can be used to provide the generation of RF pulse shapes using a small set of input parameters. As one example, only the desired bandwidth and compensation levels may be needed as input parameters. In these instances, the input parameters can be provided via user input through the UPF module.

Referring now to FIG. 1, a process flow diagram is illustrated as setting forth the basic modules of an example implementation of an RF pulse design algorithm 100 according to embodiments described in the present disclosure. As noted above, the algorithm can implement four modules: an IFSA module 102, an ISCA module 104, a CIA module 106, and a UPF module 108.

In general, the IFSA module 102 receives input data 110, such as an initial parameter set defining an initial RF pulse profile, that is processed to generate an updated parameter set defining one or more updated RF pulse profiles. The ISCA module 104 then receives the updated parameter set from the IFSA module 102 when a fidelity check is not satisfied. In these instances, the ISCA module 104 further updates the parameter set and provides the further updated parameter set to another implementation of the IFSA module 102. This iterative updating and optimization of the IFSA module 102 and ISCA module 104 creates an optimal phase surface, which in some instances is transferred to the CIA module 106 when the iterative steps reach a stopping criterion, and in some other instances may be input to a suitably trained neural network to generate output as one or more designed RF pulse shapes. Regarding the former implementations, as one example, the stopping criterion may be when the digitization limit of a given resolution of the pulse is reached. The CIA module 106 indexes the optimal phase surface and creates index files, which may be referred to as CIA files. The optimal phase surface and the CIA files are provided to the UPF module 108 to allow user selection of an RF pulse profile from the optimal phase surface. The UPF module 108 can then output RF pulse data 112, which may include the RF pulse parameters associated with the user-selected RF pulse. In some implementations, user input 114 is provided to the UPF module 108. Such user input 114 can include parameters or other data provided by a user to the UPF module 108, which may be provided via a user interface such as a graphical user interface.

The IFSA module 102 and ISCA module 104 can be based on the adiabatic evolution of a known solution-problem to a generalized set of optimal solutions. To achieve optimal solutions, the IFSA and ISCA modules iteratively perturb initial parameters of a solution (e.g., bandwidth, RF compensation, phase, and nutation angles) and re-optimize them until a theoretical limit or other suitable stopping criterion is reached.

The implementation of the IFSA module generally includes providing an initial parameter set defining an initial solution for an RF pulse design, and which includes at least a first and second parameter. As an example, the initial set of pulse parameters can include a total nutation angle, $\Theta$, a bandwidth, $\omega$, an RF compensation level, $\Delta B_1$, or combinations thereof, and may also include additional parameters.

Figure 2:
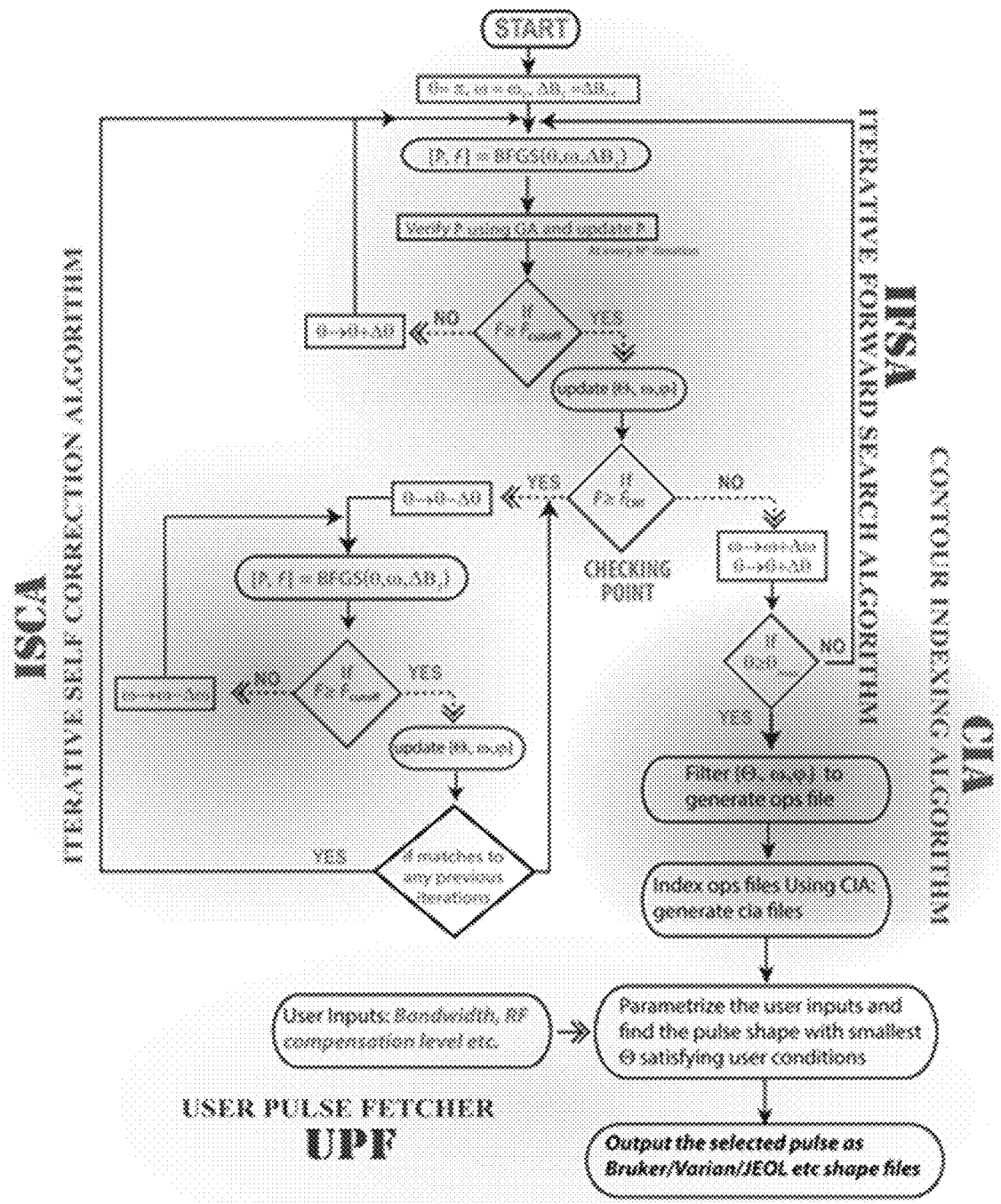
FIG. 2 is a flowchart illustrating an example implementation of the GENETICS algorithm described in the present disclosure.

To illustrate this concept, the design of a broadband inversion pulse with RF compensation level of $\pm \Delta B_1$ is provided as an illustrative example. A flowchart illustrating this example implementation of the methods described in the present disclosure is shown in FIG. 2. It will be appreciated by those skilled in the art that other RF pulses can be designed. In this illustrative example, the IFSA starts with an initial set of pulse parameters, which may define a pulse shape. For instance, in the case of inversion pulse design, the IFSA can start with a single hard pulse with a total nutation angle, $\Theta = \pi$, whose inversion bandwidth is known ($\omega = \omega_\pi$). The optimal N-point phase-shape solution ($\phi^1$) is constant (i.e., $\phi^0 = \kappa$ for 1 to N).

The first parameter in the initial parameter set is incremented by a small amount. For instance, the first parameter may be the bandwidth $\omega$, which can be incremented by a small increment, $\omega \to \omega + \Delta\omega$, and in order to perturb the critical limit of its operational fidelity.

The updated solution resulting from incrementing the first parameter is then improved adiabatically by adjusting the second parameter in the parameter set. For instance, the second parameter can be the total nutation angle and the updated solution can be adiabatically improved by increasing the total nutation angle, $\Theta \to \Theta + \Delta\Theta$. Iteratively, the IFSA module reaches the next optimal point $\{\Theta,\omega\} = \{\pi + n\Delta\Theta, \omega_\pi + \Delta\omega\}$ with phase $\phi^1$, which is stored as an updated parameter set.

The fidelity of the updated parameter set is then evaluated. At this checking point, the fidelity of the current solutions is assessed and if it is greater than a critical fidelity ($F_{CRIT}$), the self-correction module (i.e., ISCA) module is implemented. Otherwise, the updated parameter set is passed along to the CIA module.

Implementation of the ISCA generally includes systematically adjusting the first and second parameters in the updated parameter set until the optimal solutions meet the search trajectory of the IFSA module. For instance, the ISCA can systematically reduce the total nutation angle and bandwidth by small increments $\Theta \to \Theta - \Delta\Theta$ and $\omega \to \omega - \Delta\omega$ until the optimal solutions meet the search trajectory of the IFSA module.

This iterative optimization continues until a stopping criterion based on maximum values for the first parameter, second parameter, or both, is reached. For instance, the iterative optimization can continue until the bandwidth reaches a maximum bandwidth ($\omega_{max}$) that is set by the number of points (N) in the phase shape. The values $\Delta\omega$ and $\Delta\Theta$ should be chosen small enough to keep the solution close to its previous point in the iteration. These conditions help maintain the adiabaticity of the algorithms and fast optimization.

The basic optimization in each step can be performed using the BFGS (Broyden-Fletcher-Goldfarb-Shanno) algorithm. In other implementations, a different optimization algorithm can be implemented, such as gradient descent, genetic algorithm, pattern search, and so on. As one non-limiting example, the phase shape in each ISCA iteration can be maximized to a fitness function using the BFGS algorithm, or other suitable optimization algorithm. The fitness function of BFGS evaluates the mean fidelity (F) of a pulse operation to a target operator ($U_{tar}$) or target density matrix ($\rho_{tar}$). The mean fidelity (F) is evaluated for all points of the grid formed by the offset and relative RF strength arrays. For the operator optimization on a $\pi$-pulse:

$$F = \frac{1}{N_\omega N_{\Delta B_1}} \sum_\omega \sum_{\Delta B_1} \text{Trace}(U_{tar} \times U_{pul}^\dagger); \tag{1}$$

For state optimization on an inversion pulse:

$$F = \frac{1}{N_\omega N_{\Delta B_1}} \sum_\omega \sum_{\Delta B_1} \text{Trace}(\rho_{tar} \times U_{pul} \times \rho_{ini} \times U_{pul}^\dagger); \tag{2}$$

where $U_{tar}$ is the target operator, $U_{pul}$ is the current pulse operator in the optimization, $\rho_{ini}$ is the initial state, $\rho_{tar}$ is the target state, $N_\omega$ is the number of fidelity points evaluated for the bandwidth, and $N_{\Delta B_1}$ is the number of fidelity points evaluated for RF. In the case of universal $\pi$-pulse design, the target operator is, $$U_{tar}{}^\pi = e^{-i\pi I_x} \tag{3};$$

and for inversion pulse design, the target state is, $$\rho_{tar}{}^{in} = -I_z \tag{4};$$

where $I_x$ and $I_z$ are Pauli spin matrices.

The optimization progress of ISCA can be tracked by the progression of the $\{\Theta,\omega/B_1\}$ pairs that satisfy the minimum fidelity conditions. The self-correction routine is advantageous for improving the optimization because it can find the optimal trajectory, $\{\Theta,\omega/B_1\}$, with lower total nutation angle for the same bandwidth, which may in some instances be missed by the IFSA optimization.

Figure 3:
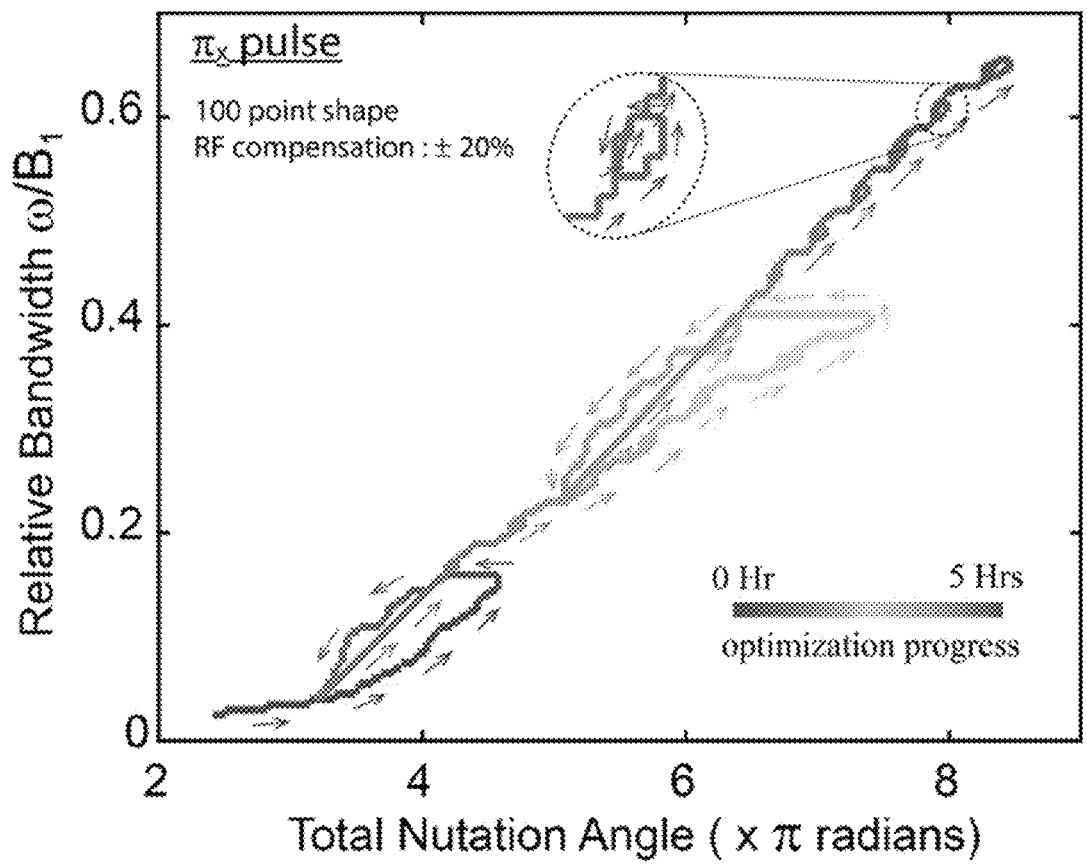
FIG. 3 depicts an illustration of the self-correcting routine built into the ISCA module for a $\pi_x$ pulse mapped onto the $\{\Theta, \omega/B_1\}$ space. During the execution of GENETICS, this iterative optimization process is generally carried out in more than 100 dimensions.

FIG. 3 shows an example of an iterative progression of optimal $\{\Theta,\omega/B_1\}$ for a 100 point universal $\pi$-pulse design. For each step of this optimization, the self-correction routine checks the mean fidelity (F) of the $\{\Theta,\omega/B_1\}$ pairs. If the fidelity is greater than a set maximum value (e.g., 99.95 percent), the self-correction routine of the ISCA module will be activated to iteratively reduce both the nutation angle $\Theta$ followed by bandwidth $\omega \rightarrow \omega - \Delta\omega$. This process continues until the updated trajectory meets the old trajectory. Without the self-correction routine, the optimal pairs $\{\Theta,\omega/B_1\}$ may result in larger nutation angles, which can lead to an increase of the pulse length or RF power necessary to perform a given operation.

Figure 4:
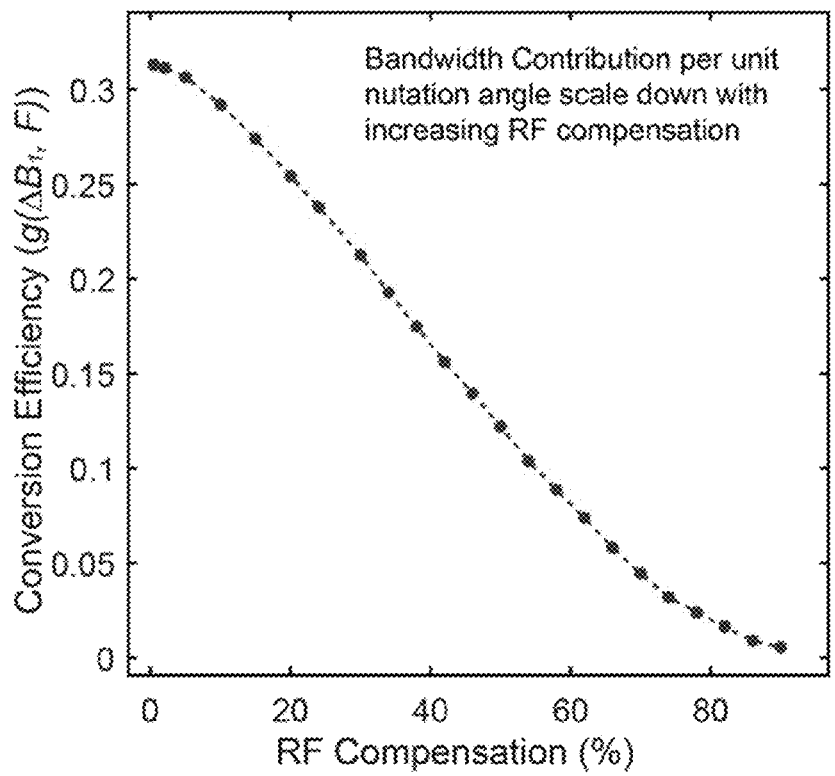
FIG. 4 is a data plot showing the conversion efficiency for a given RF compensation level for a 100-point inversion pulse.

Generally, as $\Theta$ increases, the span of the bandwidth increases. This can be described as a "resource to output" conversion problem, where $\Theta$ is the resource and the bandwidth corresponds to the output ($\omega$ or $\Delta B_1$). The iterative evolution of optimal solutions along with the self-correction routine in the ISCA module enables the methods described in the present disclosure to achieve a fast and optimal "resource to output" conversion. Mathematically this can written as, $$\Theta \xrightarrow[IFSA\&ISCA]{} \omega(F) \times g(\Delta B_1, F); \quad (5)$$

where the nutation angle per bandwidth is, $$\frac{\Theta}{\omega} = g(\Delta B_1, F); \quad (6)$$

and where $g(\Delta B_1,F)$ is the conversion efficiency and F is the operation fidelity. The conversion efficiency decreases as the RF compensation increases, as shown in FIG. 4. Note that the definition of bandwidth and RF compensation level of a pulse is based on the area centered at the origin of a two-dimensional $\omega$ versus $\Delta B_1$ plot (i.e., fidelity profile) and has fidelity greater than or equal to F.

Figures 5A, 5B:
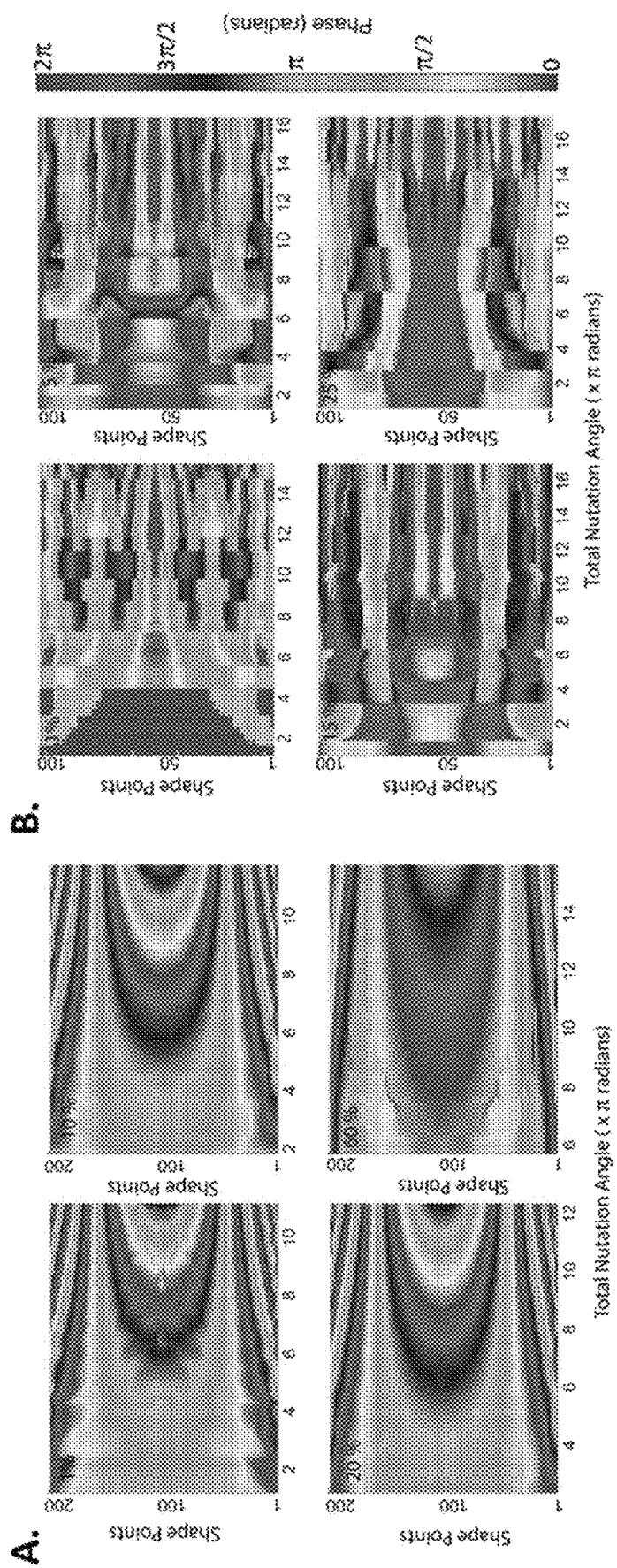
FIGS. 5A and 5B illustrate examples of optimal phase surfaces ("OPS") of 200-point inversion pulses with RF compensation levels level ±1, ±10, ±20, and ±60% (FIG. 5A), and OPS for a 100-point $\pi$ pulses with RF compensation levels 1%, 5%, 15% and 25% (FIG. 5B).

During the iterative evolution of IFSA and ISCA, every acceptable solution can be output and stored. As one example, the solutions can be output as textual data in the form of a text file. At the end of the IFSA and ISCA modules, a filtering protocol can be implemented to scan all of the solutions in the output data and to select those solutions with the smallest total nutation angle. This final unique solution set forms an optimal phase surface ("OPS"). Each string in the OPS represents an optimal phase modulation for the corresponding total nutation ($\Theta$) and bandwidth ($\omega$), or other pair or combination of parameters in the parameter set. An example of different OPS for 200-point inversion pulse shapes with RF compensation level ±1, ±10, ±20, and ±60 percent are shown in FIG. 5A. An example of different OPS for universal $\pi$-operation pulses with RF compensation levels 1 percent, 5 percent, 15 percent, and 25 percent are shown in FIG. 5B.

Figure 6:
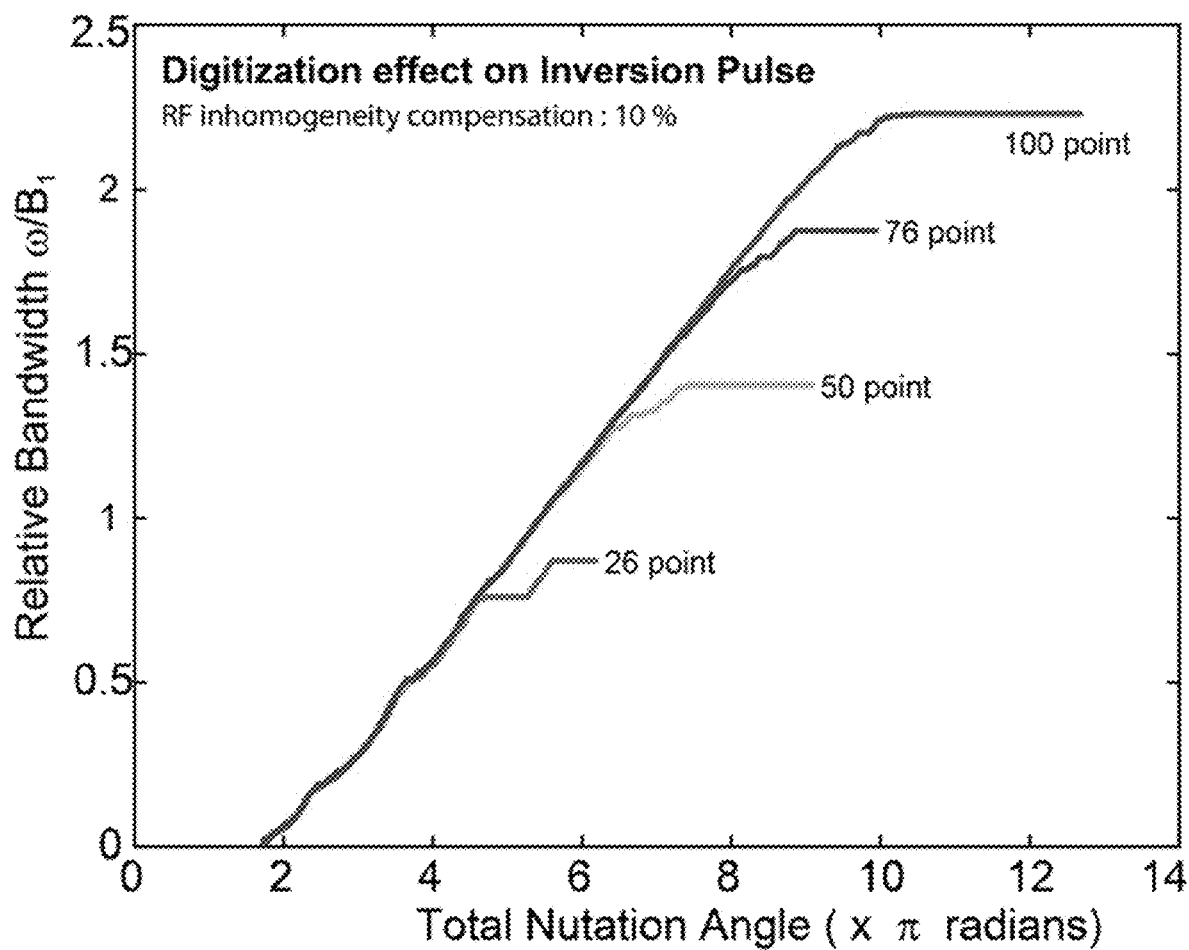
FIG. 6 depicts an example of total nutation angle to bandwidth conversion of inversion pulse for 26, 50, 76 and 100-point shapes. The maximum bandwidth increases with shape resolution.

FIG. 6 shows a plot that illustrates the performance of the methods described in the present disclosure using different digitization of the pulse shapes. For a 26-point shape the $\omega_{max}$ achieved is approximately 0.8 $B_1$, while for a 50-point shape, the maximum bandwidth is approximately 1.4 $B_1$.

Figure 7:
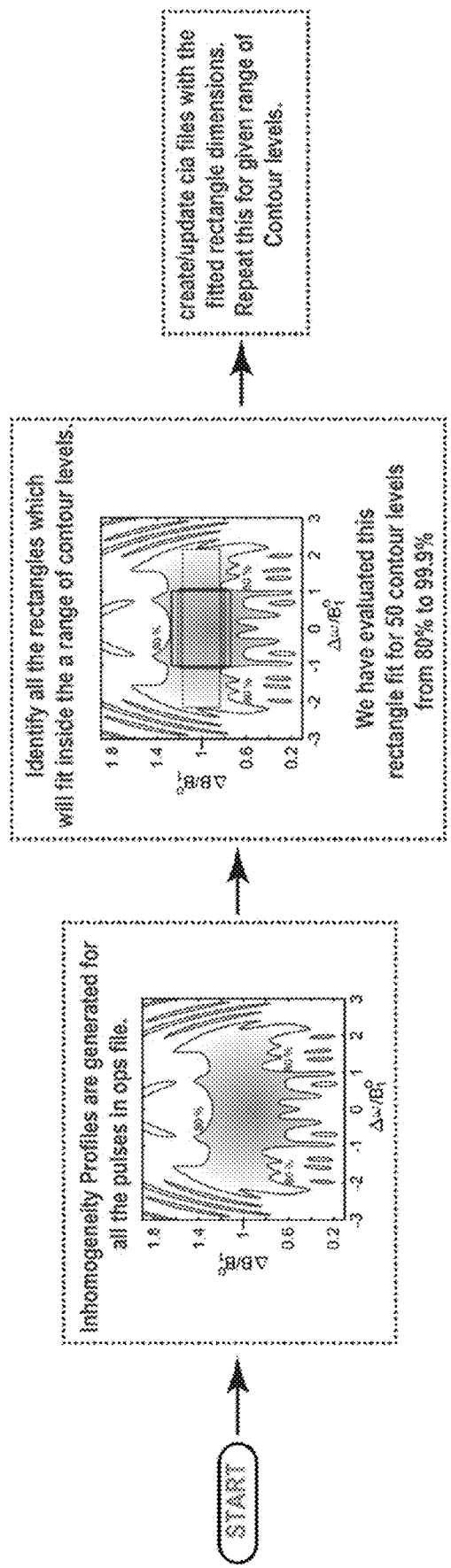
FIG. 7 illustrates an example implementation of the CIA module, in which fidelity profiles are searched to find the fidelity rectangles with contour intervals from 80.0-99.9%. CIA evaluates all of the possible rectangles maximizing the heights and widths until it reaches the input contour levels.

Once the OPS have been generated, the CIA module is implemented to index the phase strings of the OPS in order to make the search for the desired pulse shape straightforward. An example of this process is illustrated in FIG. 7. As one example, the CIA module can be programmed to find the dimensions of all rectangles within the fidelity plots for a desired bandwidth and RF compensation level and to search for the best phase shape, which may be saved in "CIA-files". Alternatively, the OPS may be input to a suitably trained neural network in order to generate output as one or more designed RF pulse shapes.

Finally, the user input can be provided to select desired RF pulse parameters for selecting the desired RF pulses. For example, a user can provide a desired bandwidth and RF compensation level, and based on that selection the UPF module can retrieve the pulse shape within a few seconds with the desired format for any spectrometer.

Figure 8:
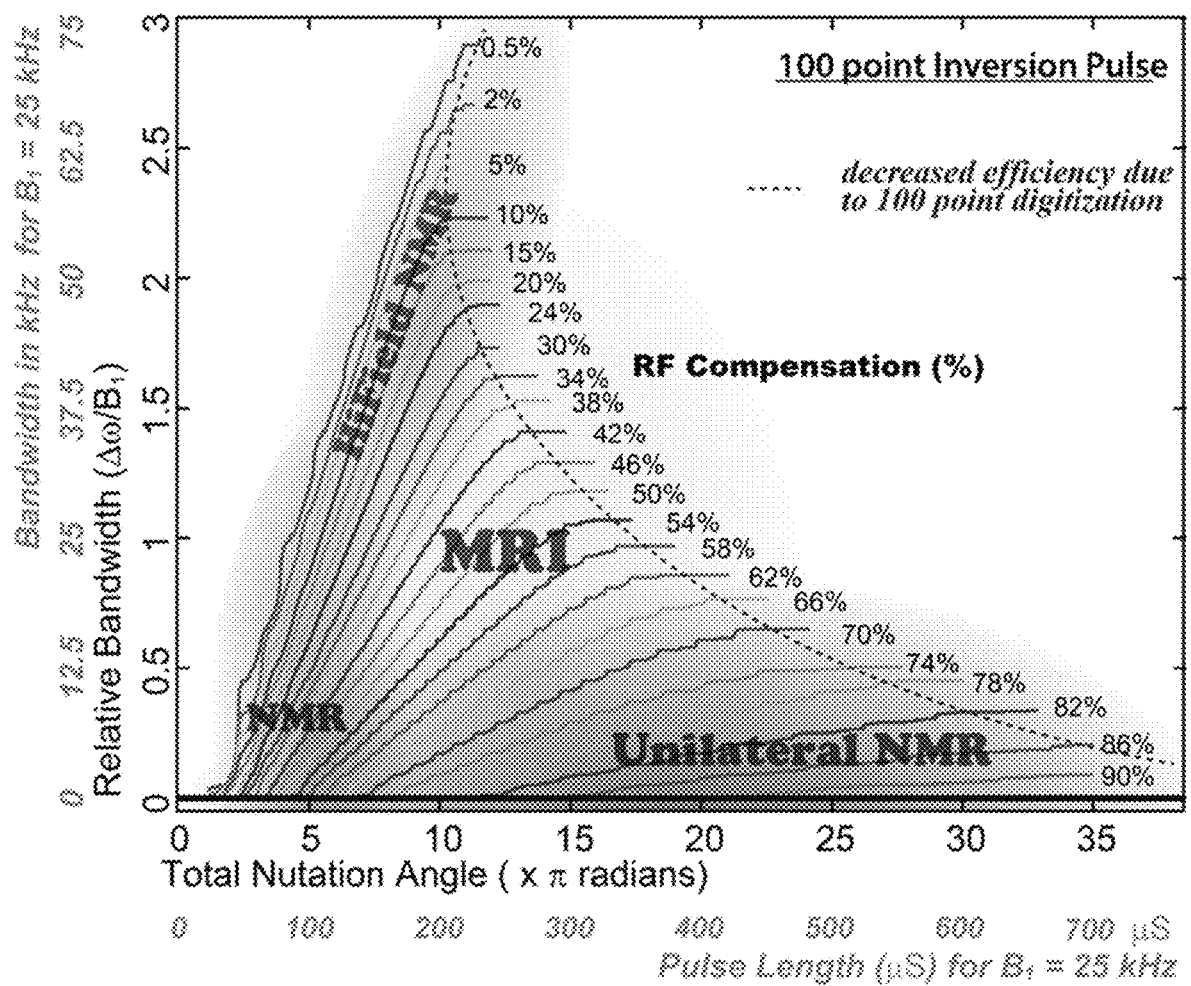
FIG. 8 illustrates an example of optimal solution points $\{\Theta, \omega\}$ obtained by GENETICS for various RF compensation levels from 0.5% to 90% for a 100-point inversion operation.

The RF pulses generated with the methods described in the present disclosure can handle multiple applications, spanning from high-resolution solution and solid-state NMR to MRI, EPR, and unilateral NMR. The methods described in the present disclosure are inherently flexible and able to generate solutions $\{\Theta, \omega\}$ for various RF compensation levels, ranging from 0.5-90 percent. FIG. 8 shows an example of the different levels of compensations that can be achieved using the methods described in the present disclosure for different NMR spectroscopies. The RF pulses designed using the methods described in the present disclosure meet the requirements for all of these experiments, with less than 2 percent compensation ($\Delta B_1/B_1$) for high-resolution NMR, 30-50 percent for MRI and, greater than 50 percent for unilateral NMR.

Figure 9A:
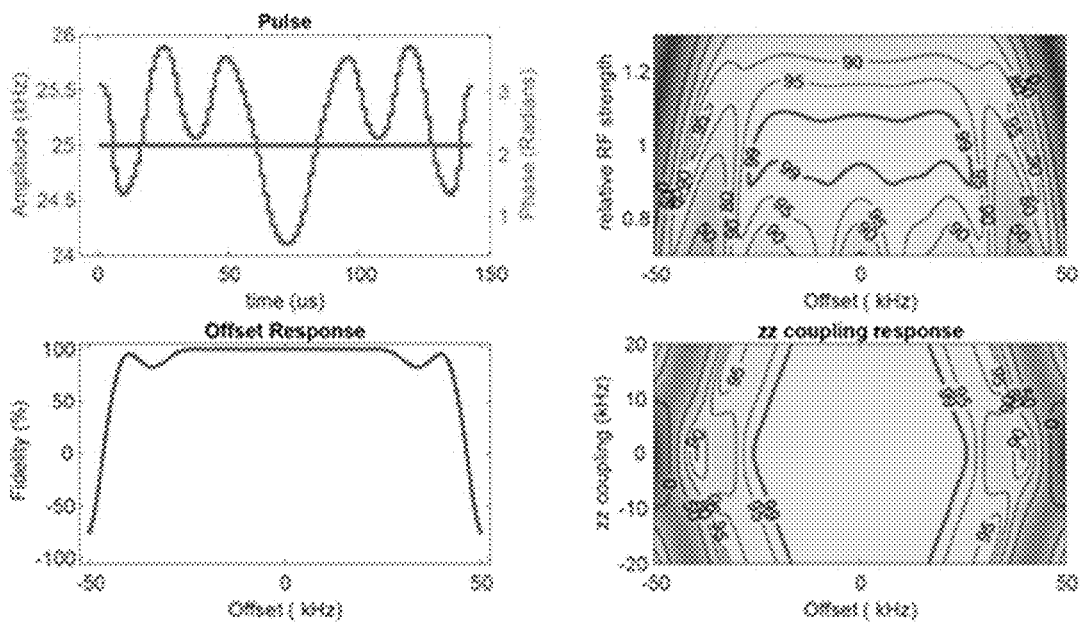
FIGS. 9A and 9B show examples of GENETICS generated broadband universal $\pi$ pulses of bandwidth 50 kHz with ±5% RF compensation and ±10% RF compensation. Both pulses were simulated using NMR-SIM routine in Topspin software.
Figure 9A:
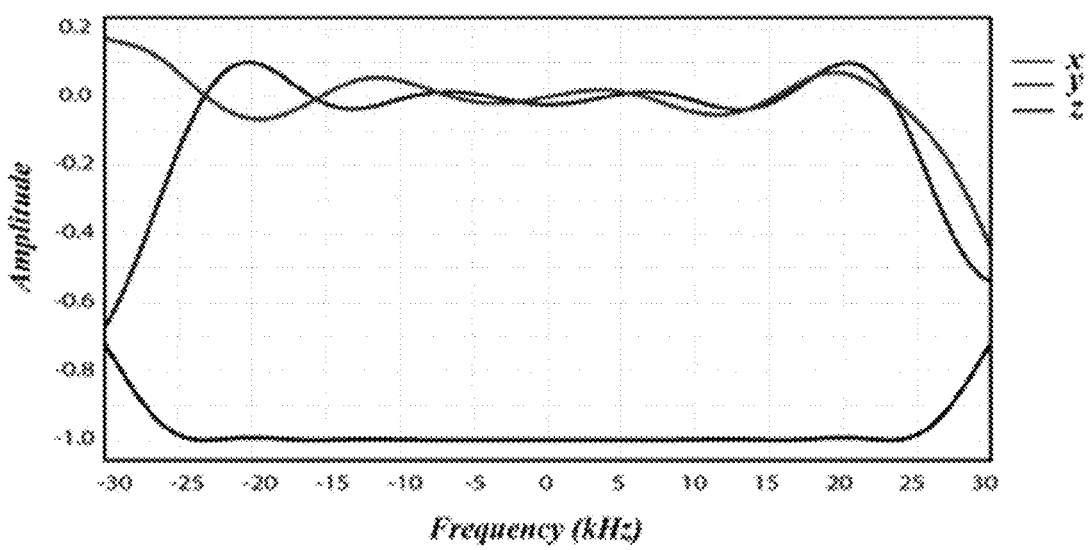
Figure 9B:
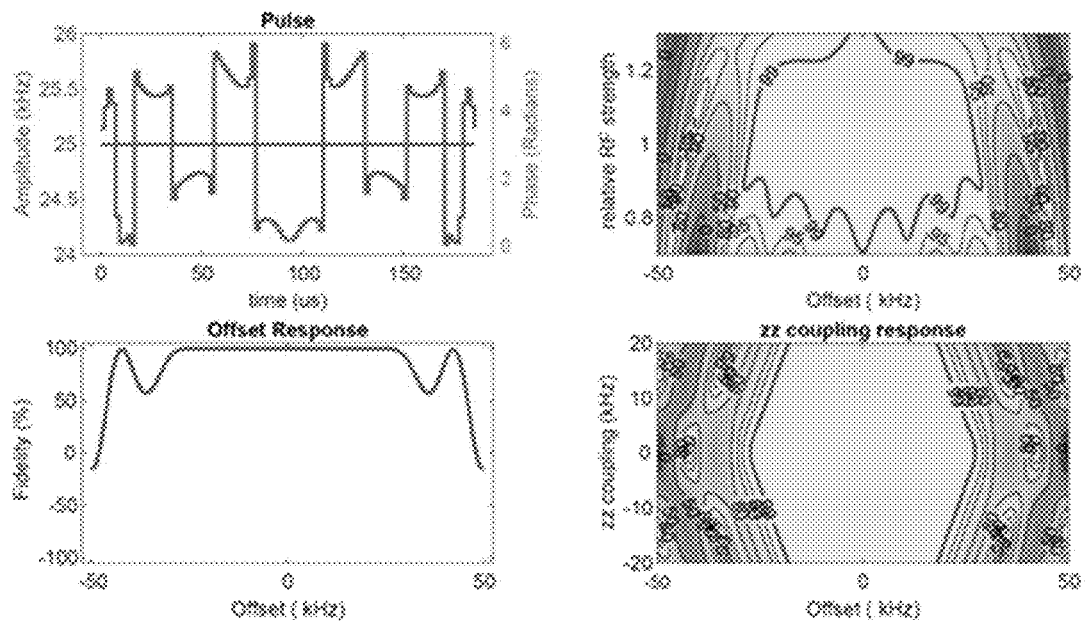
Figure 9B:
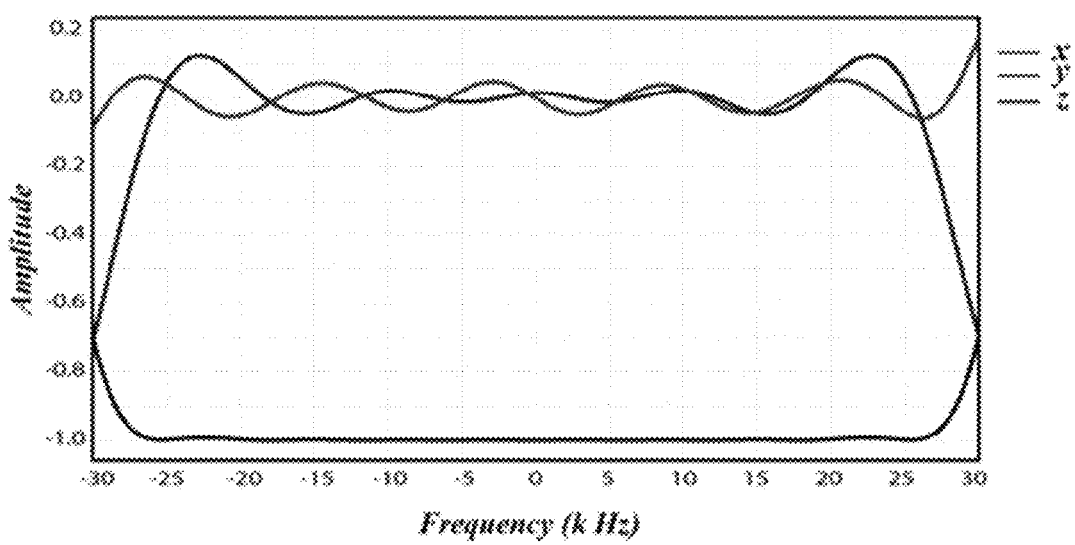
Figure 10A:
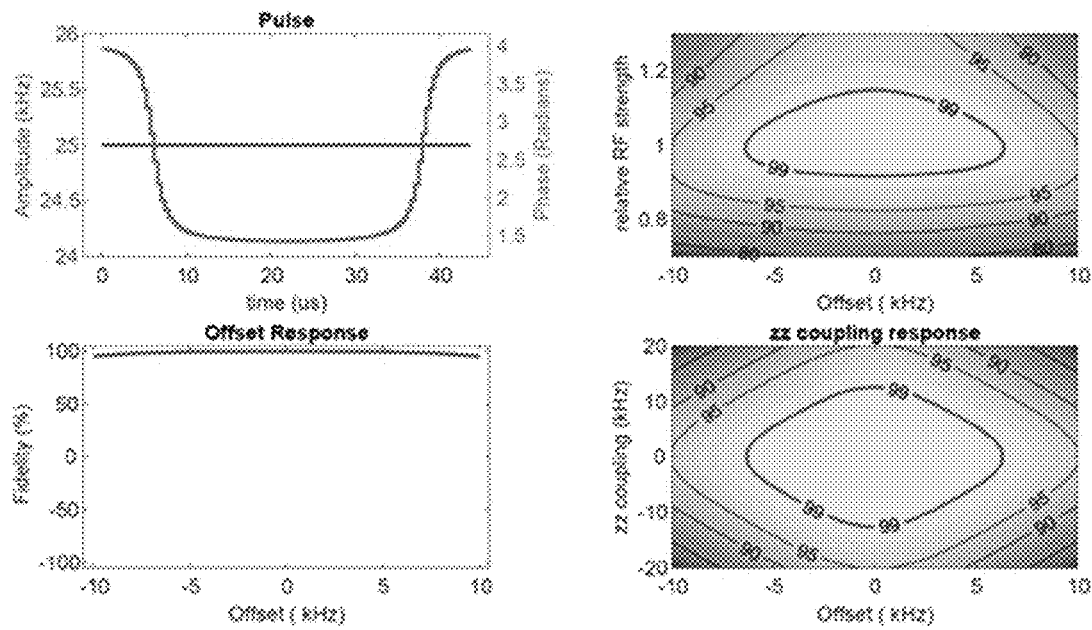
FIGS. 10A and 10B show examples of GENETICS generated broadband inversion pulses of bandwidth 10 kHz with ±5% RF compensation (FIG. 10A) and 50 kHz bandwidth with ±10% RF compensation (FIG. 10B). Both pulses were simulated using NMR-SIM routine in Topspin software.
Figure 10A:
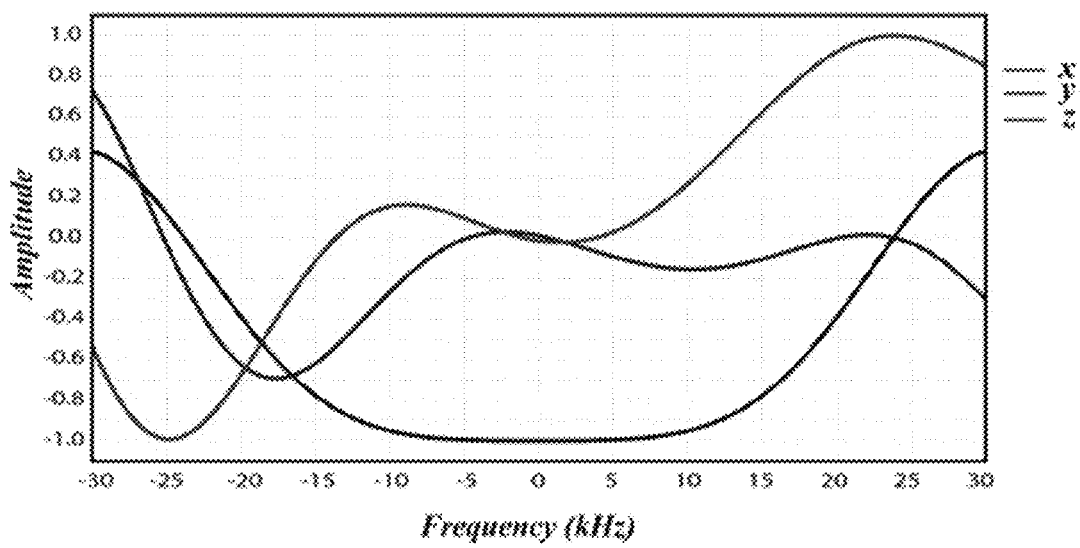
Figure 10B:
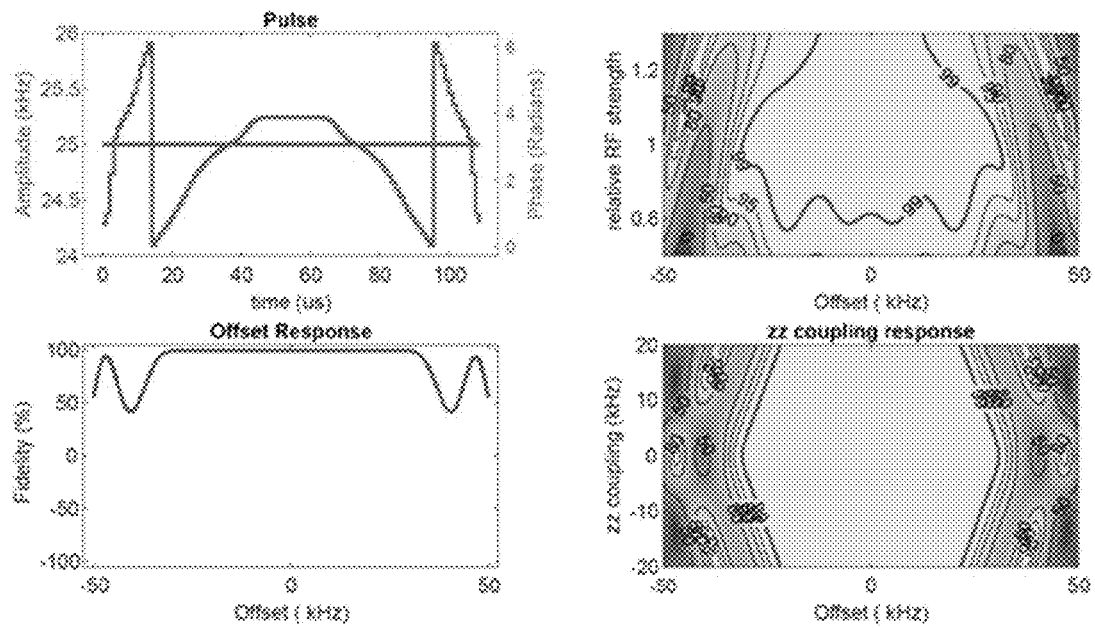
Figure 10B:
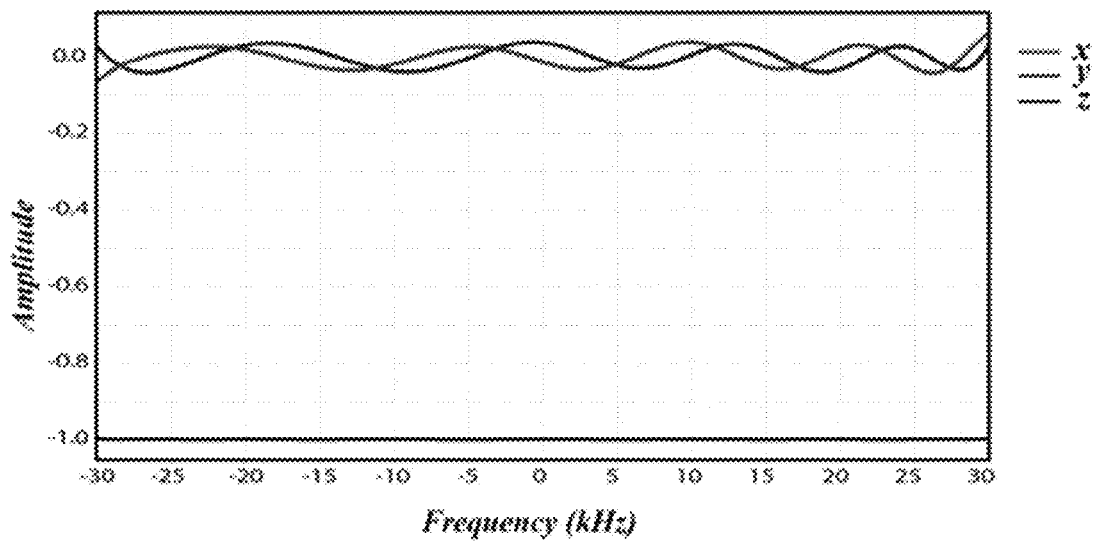
Figure 11A:
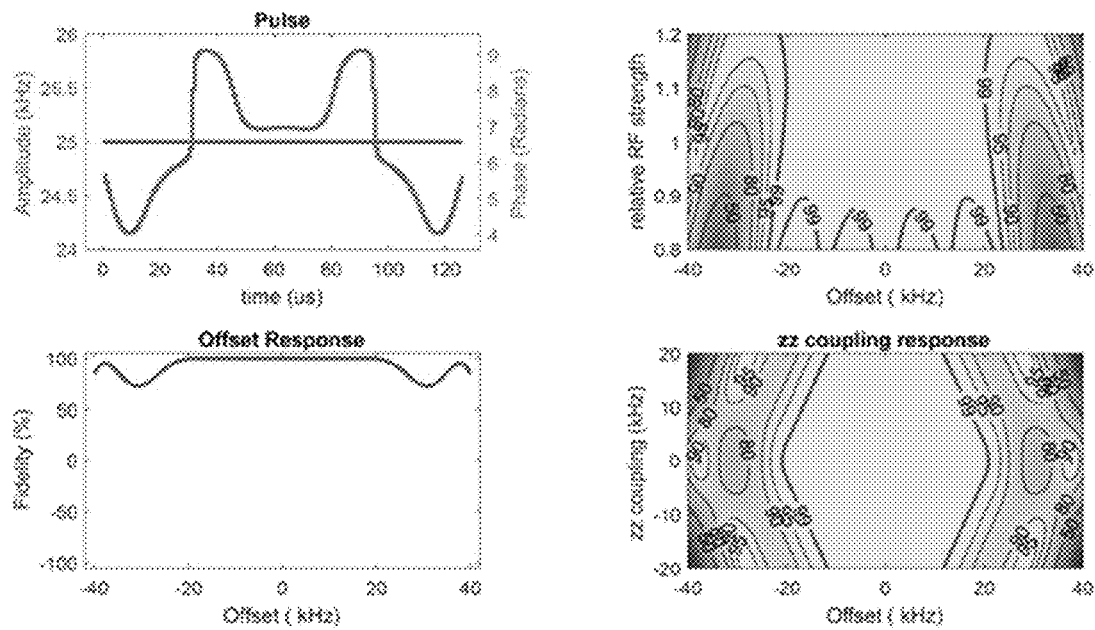
FIGS. 11A and 11B show examples of GENETICS generated broadband $\pi/2$ pulses with 40 kHz and 80 kHz bandwidth. The RF compensations for these pulses are ±10%. Both pulses were simulated using NMR-SIM routine in Topspin software.
Figure 11A:
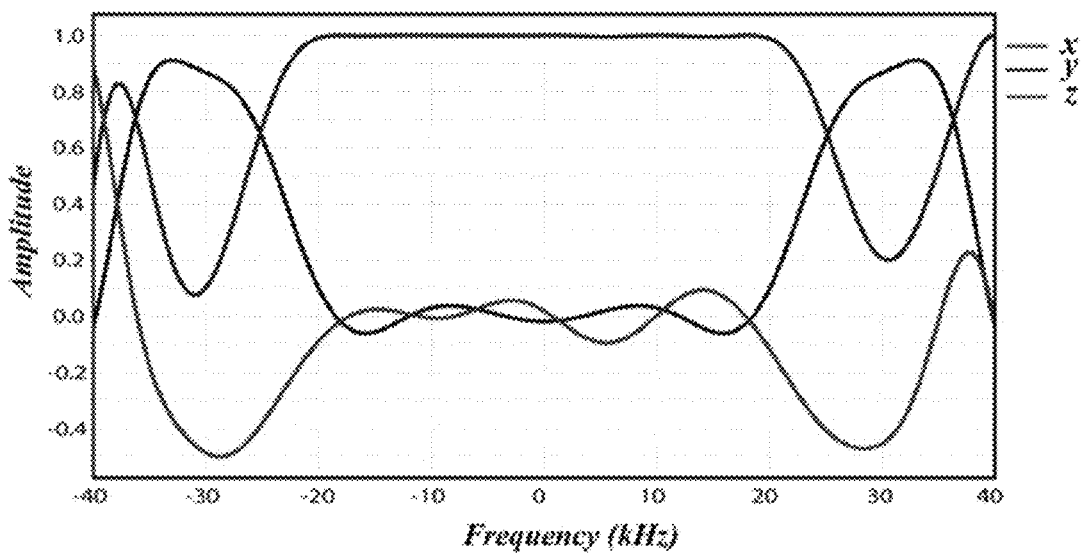
Figure 11B:
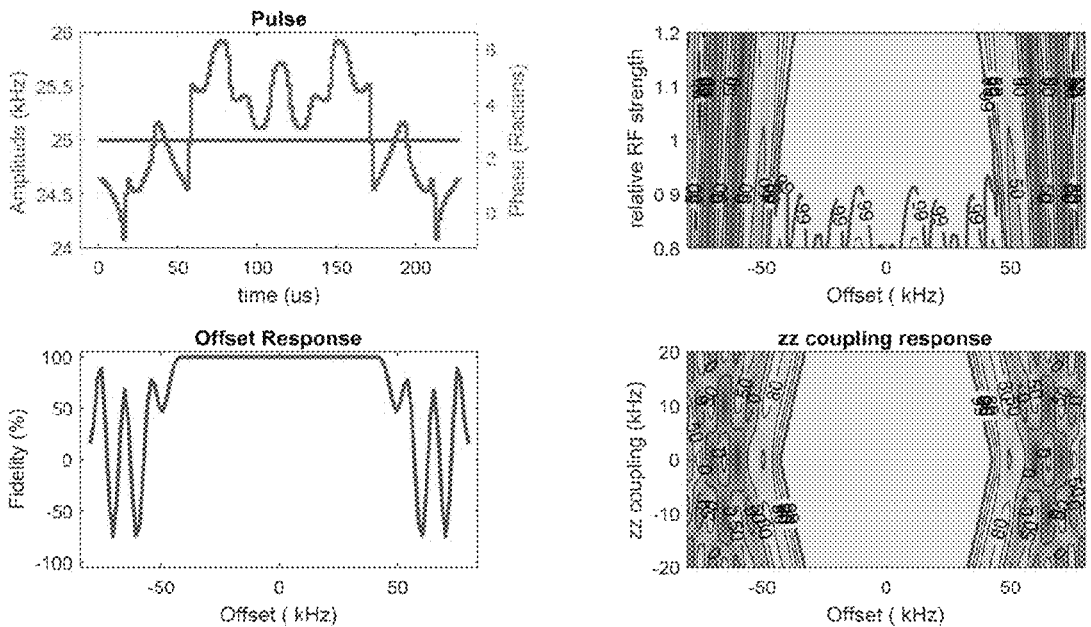
Figure 11B:
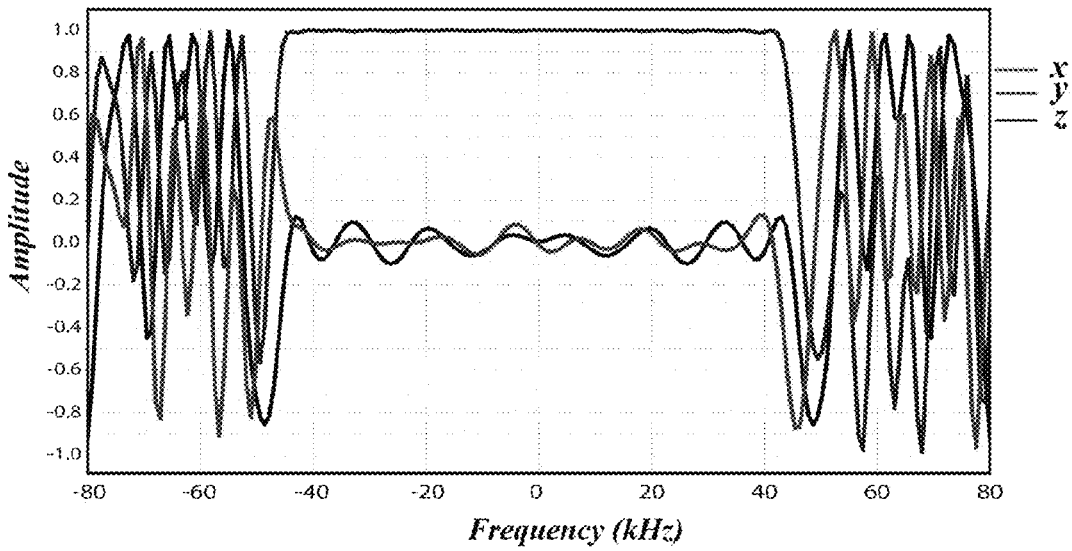

In one example study, inversion pulses were analyzed for 10 kHz (FIG. 10A) and SO kHz (FIG. 10B) bandwidths. RF inhomogeneities of ±5% and ±10% were input for the 10 kHz and 50 kHz pulses, respectively. The minimum pulse fidelity was kept at 99% for both cases. GENETICS generated pulse shapes of 43.66 μs for 10 kHz and 109 μs for 50 kHz bandwidths, respectively. For the universal $\pi$ pulse, which can be used for both refocusing and inversion, two different pulses that use 50 kHz bandwidths were chosen with two compensation levels: ±5 and ±10%. For the ±5% RF compensation level, the pulse generated had a duration of 143.37 μs (FIG. 9A); while for the ±10% compensation the pulse had a 185.57 μs duration (FIG. 9B). Broadband $\pi/2$ pulses with 40 kHz and 80 kHz bandwidths are shown in FIGS. 11A and 11B.

All pulses in this example were composed by 100 points, which enables bandwidths and RF compensation levels for most NMR experiments. For ultra-short pulses or ultrahigh bandwidth pulses, the shape points can be varied accordingly. These features of GENETICS offer advantages over previously designed adiabatic pulses. In these examples, the search program took less than 1 second to generate Bruker-compatible pulse shape files and less than 6 seconds to simulate these pulses in the pulse simulator. The performance of all the output shape files were verified using 'NMR-SIM' routine in Bruker Topspin software, the results of which are shown in the corresponding figures.

Figure 12:
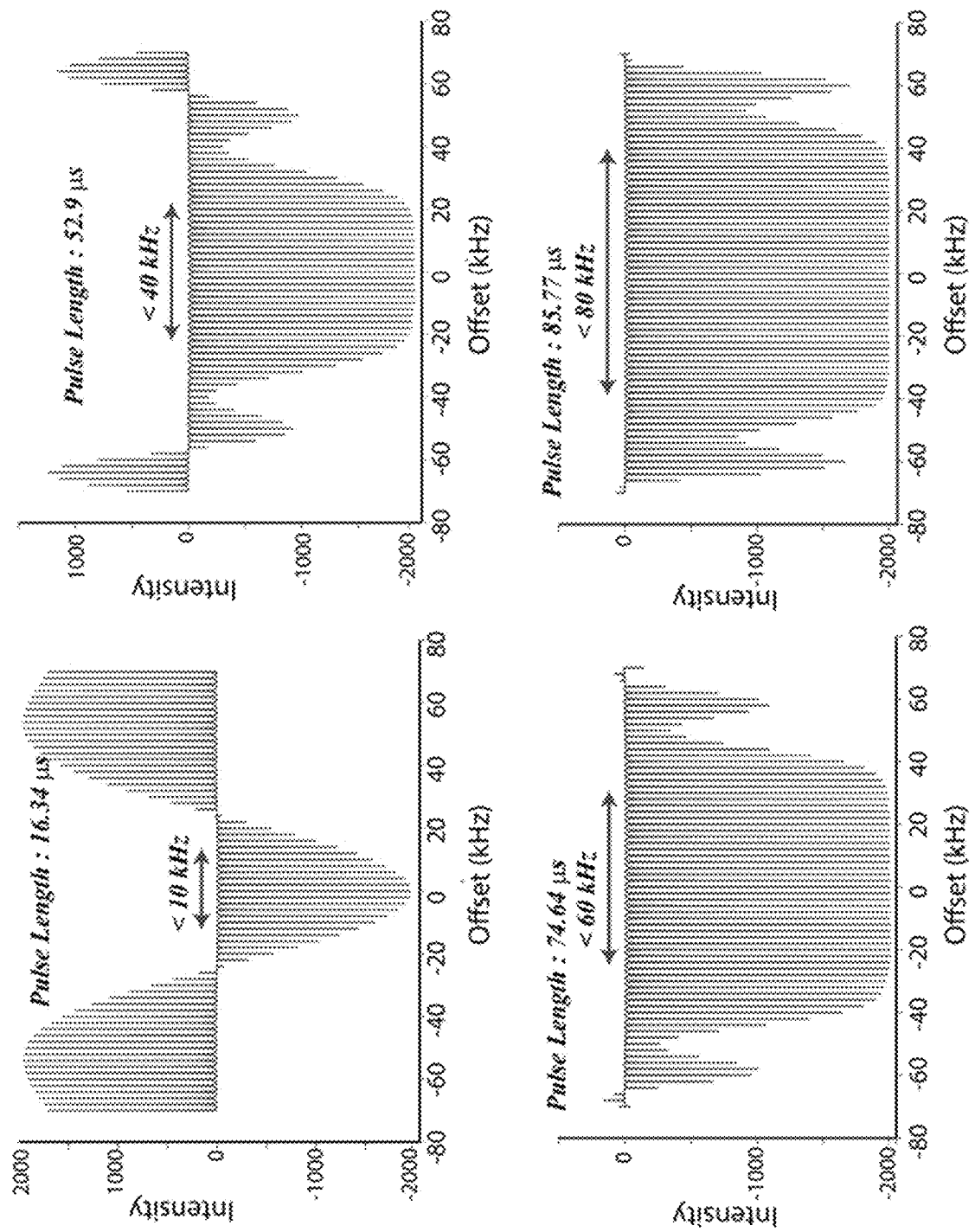
FIG. 12 shows an experimental verification of inversion pulses generated using GENETICS tested on a D2O H2O (99:1) sample in 850 MHz spectrometer.

To test the performance of the generated pulses on an 850 MHz Bruker spectrometer, a $D_2O:H_2O$ (99:1) sample was used and the performance of the new pulses was compared with a hard $\pi$ pulse, as shown in FIG. 12.

Figure 13:
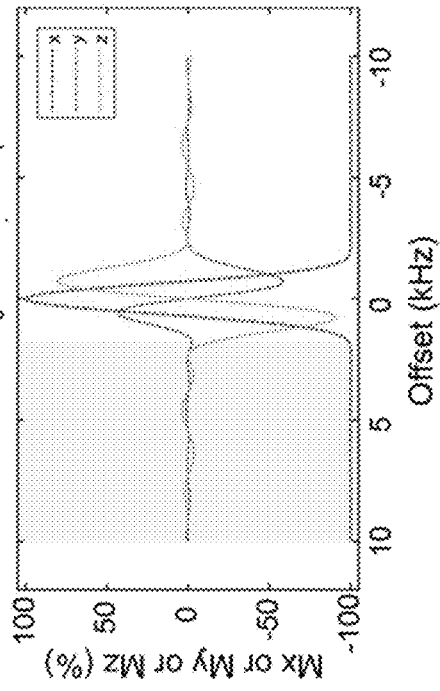
FIG. 13 shows a comparison of the binomial water suppression using the 3-9-19 sequence and the single pulse generated with GENETICS. Left: water suppression profiles obtained with the commonly used 3-9-19 sequence. Right: shaped pulse generated with GENETICS. Note that the bandwidth of amide protons (yellow shaded area) is much larger with the newly generated pulse.
Figure 13:
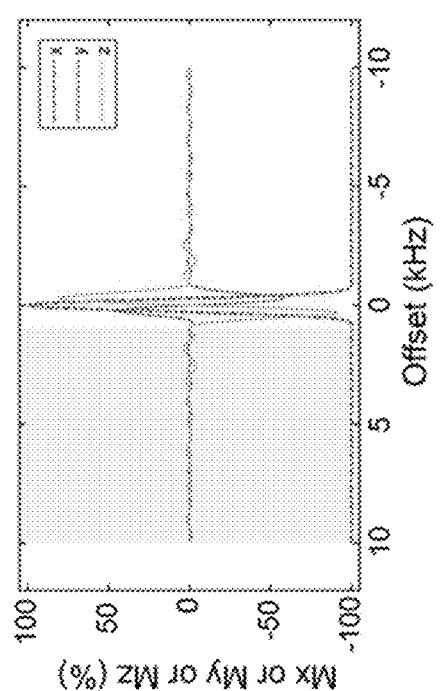
Figure 13:
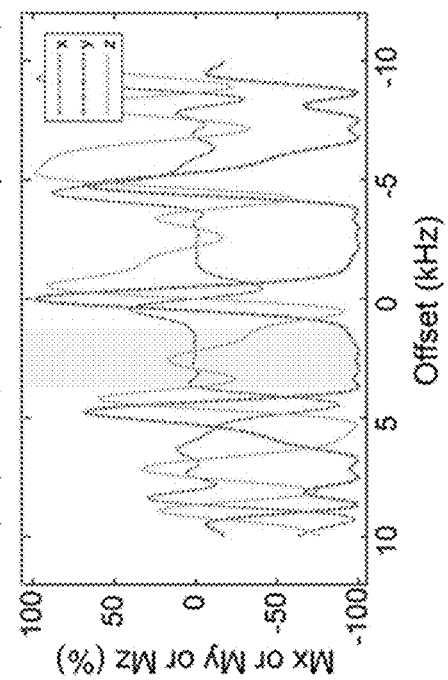
Figure 13:
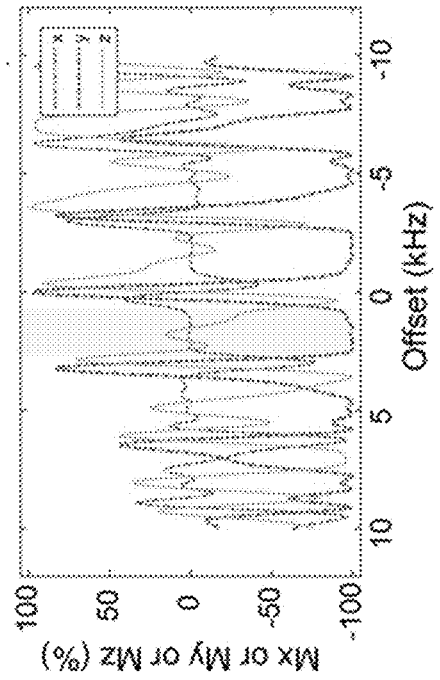

In another example study, the methods described in the present disclosure were used to design a new binomial pulse for water suppression. Water suppression is a significant problem in many NMR experiments, including high-resolution solution and solid-state NMR spectroscopy. In this example, a 3-9-19 pulse sequence, which is commonly used in multidimensional solution NMR spectroscopy, was implemented. The 3-9-19 pulse sequence is a binomial sequence composed of a total of six pulses for a typical duration of approximately 1 millisecond. The 3-9-19 sequence selectively refocuses the solute resonances, while the on-resonance solvent magnetization is dephased by two gradients. GENETICS replaced the entire 3-9-19 sequence with only one binomial pulse with higher operational fidelity and a much wider bandwidth, as shown in FIG. 13.

This new binomial pulse can achieve a significantly higher selectivity, while maintaining the same refocusing bandwidth, which avoids peak cancellation in homonuclear spectroscopy such as 1H-1H NOESY and 1H-1H TOCSY experiments.

Figures 14A, 14B, 14C, 14D:
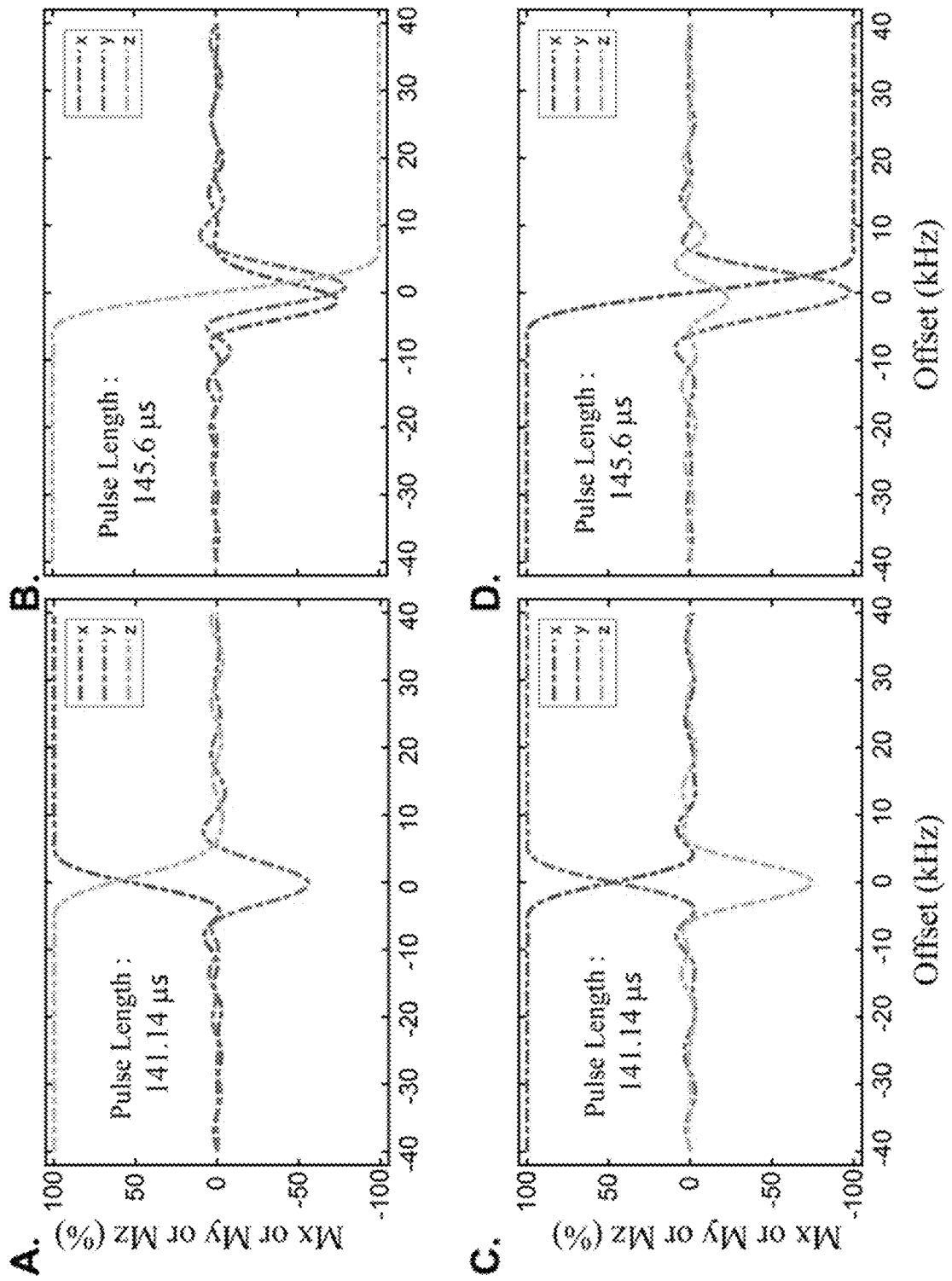
FIGS. 14A-14D show excitation profiles of multi band selective RF pulses designed using GENETICS.

In another example study, the methods described in the present disclosure were used to generate band-selective pulses with high fidelity. As an example, band selective excitation and inversion pulses were generated. The excitation profiles for the magnetization are reported in FIG. 14A. In this case, the resonances at negative offsets were essentially unaffected, while the resonances at positive offsets were excited (Mx). A selective inversion of a specific band-width could also be operated. In FIG. 14B, the resonances at negative offsets were unaffected, while those at positive offset values were inverted selectively. GENETICS can thus operate a selective control on different band-widths. Two more cases are shown in FIGS. 14C and 14D, where the two components of the magnetization are excited and tipped onto the x-y plane with a 90 or 180-degree phase difference.

Figures 15A, 15B:
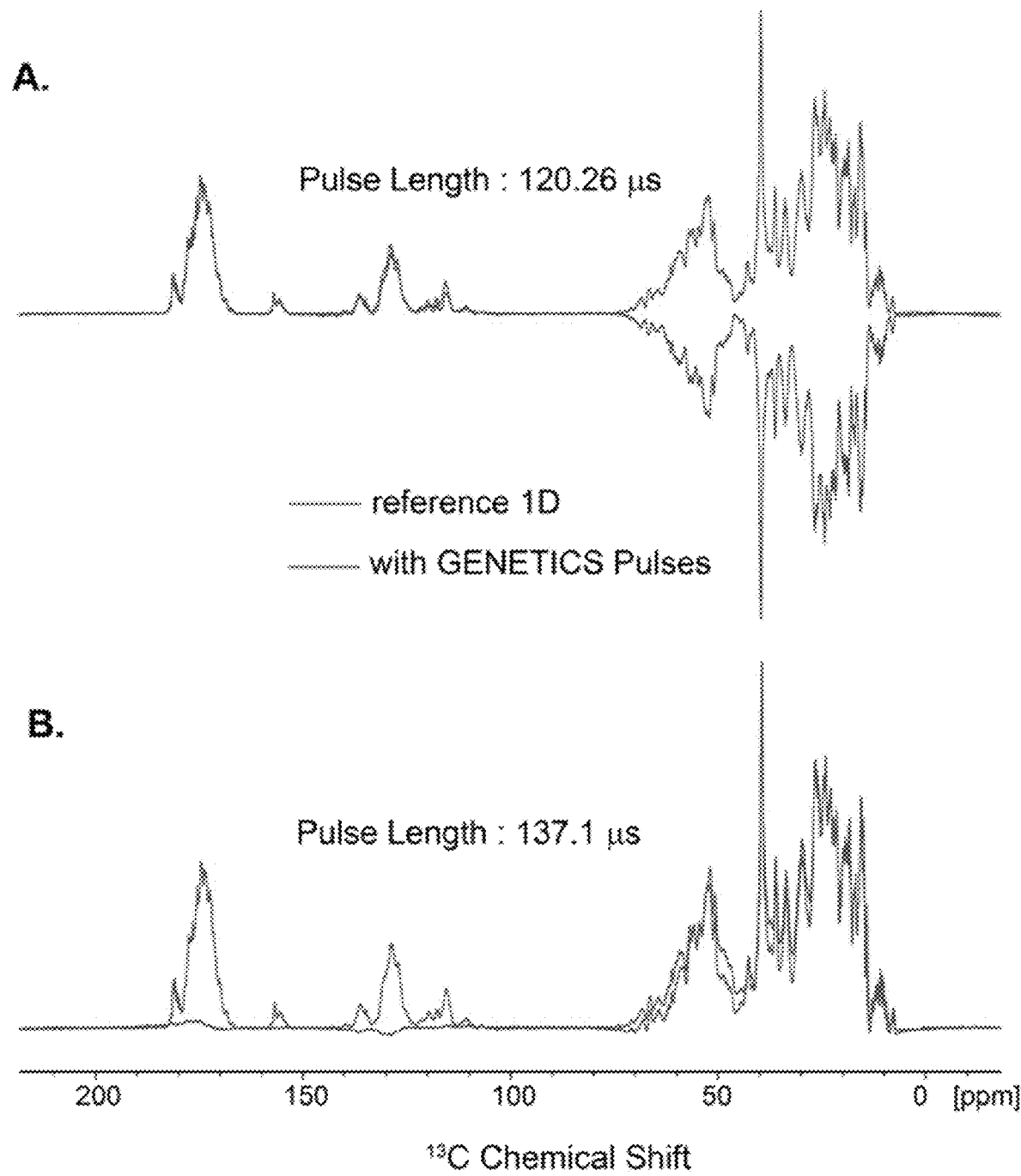
FIGS. 15A and 15B show band selective inversion (FIG. 15A) and excitation (FIG. 15B) pulses using GENETICS pulses. Experiment performed in 600 MHz spectrometer. Used 13C-15N labelled maltose-binding protein.

As an example, the application of GENETICS selective pulses on the carbon-13 spectrum of a large protein (Maltose Binding Protein) was studied. FIG. 15A shows the selective inversion obtained from the pulse simulated in FIG. 14B. FIG. 15B shows band selective excitation obtained with the profile shown in FIG. 14A.

The sensitivity of NMR experiments depends on $B_0^{3/2}$, where $B_0$ indicates the static magnetic field. Over the past decades, there has been a significant effort to increase the strength of static magnetic fields and modern spectrometers for high-resolution NMR are equipped with magnets that can reach up to 1.3 GHz. However, the pulses used to carry out spectroscopy are limited in excitation, inversion, and refocusing bandwidths. Increasing the power of the RF ($B_1$) is not a viable option because it causes probe arching and might damage the hardware, particularly for cryogenic probes. This problem is exacerbated for experiments carried out at ultra-high field ("UHF").

Figures 16A, 16B, 16C:
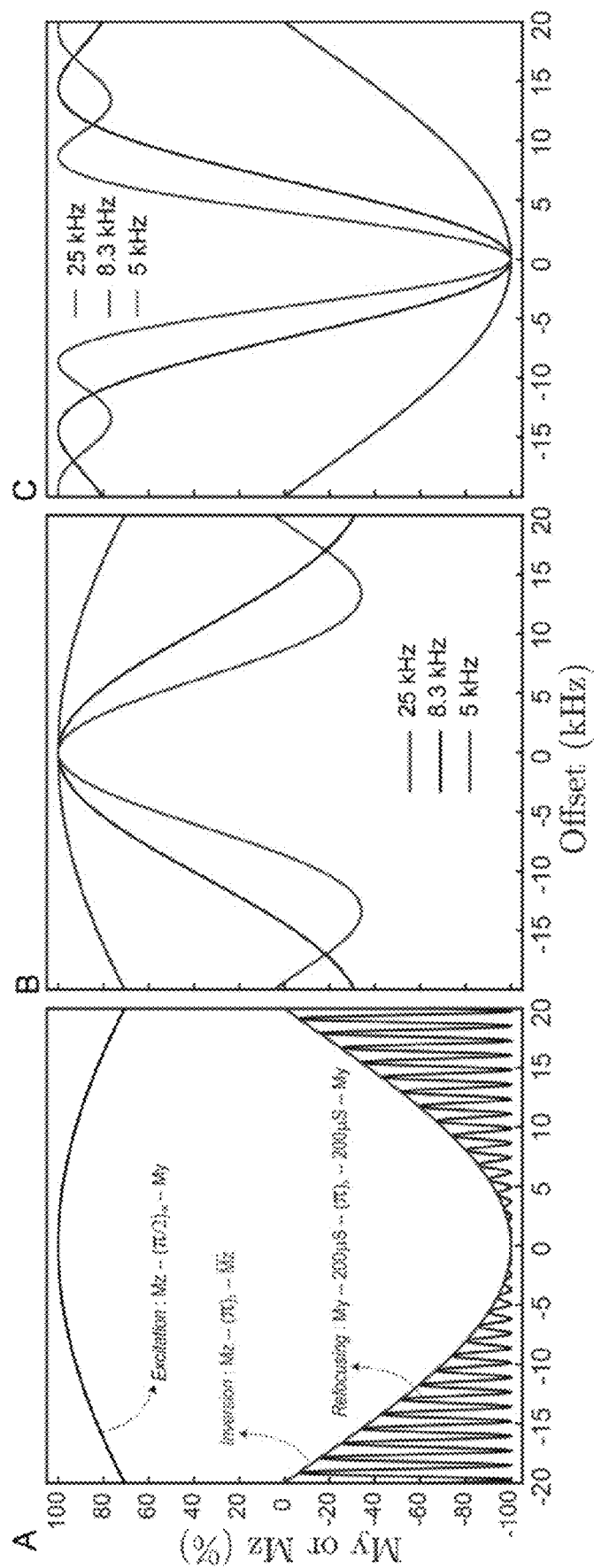
FIGS. 16A-16C show examples of excitation (black), inversion (red), and refocusing (blue) profiles for hard pulse at 25 kHz field strength (FIG. 16A). Excitation profiles for hard pulse with RF field strength of 25 kHz, 8.3 kHz, and 5 kHz are shown in FIG. 16B. Inversion profiles for hard pulse with RF field strength of 25 kHz, 8.3 kHz, and 5 kHz are shown in FIG. 16C. As the field strength decreases, the bandwidth decreases and artifacts are generated due to longer pulse durations.

A possible solution is to use RF pulses with ultra-broad operational bandwidths. As the bandwidth of RF pulses becomes smaller the power decreases and ultra-broad band pulses become equivalent to low-power pulses with regular bandwidth. Hence, the design of low-power RF pulses provides a solution to the bandwidth problem for UHF. However, reducing RF pulse power affects the bandwidth as well as the spectral quality. For instance, to achieve the desired nutation angle, low-power RF pulses generally need to be applied for a longer time, which results in a smaller excitation band and leads to phase distortions and lower peak intensities. The increased pulse length may also cause magnetization losses due to the intrinsic relaxation mechanisms of the system under examination. FIGS. 16A-16C shows examples of simulated profiles for excitation and inversion pulses at three different RF field strengths. Based on this figure, it can be anticipated that at UHF, experiments will be limited by reduced excitation or inversion bandwidths.

To overcome this problem, the systems and methods described in the present disclosure can be used to create new ultra-low power ("ULP") pulses. These ULP pulses utilize RF powers less than $\frac{1}{100}$ of the regular high-power pulses used in current NMR spectrometers. Because ULP pulses possess an ultra-broad operational bandwidth, they can be used for several operations including excitation, inversion, universal $\pi$, $\pi/2$, binomial water suppression, and so on. The implementation of these ULP pulses on GHz spectrometers is straightforward and their use will have a direct impact on the quality of NMR spectra. In addition, the introduction of ULP pulses can avoid the use of expensive high-power RF amplifiers that can instead be replaced with low-power RF amplifiers.

As noted, the methods described in the present disclosure can be used to generate ULP pulses. These ULP pulses enable the use of NMR with ultra-high magnetic fields (e.g., >1 GHz) with broader excitation profiles. By designing ULP pulses, expensive high-power RF amplifiers can be replaced with significantly more economic, low-power RF amplifiers. In addition, ULP pulses can be used for MRI in order to drastically reduce high RF energy depositions, thereby enabling higher resolution imaging. It is contemplated that ULP NMR will enable the miniaturization of NMR spectrometers to provide mobile NMR solutions, bench top spectrometers, NMR mouse devices, and so on, with significant gain in compactness and transportability.

Figures 17A, 17B:
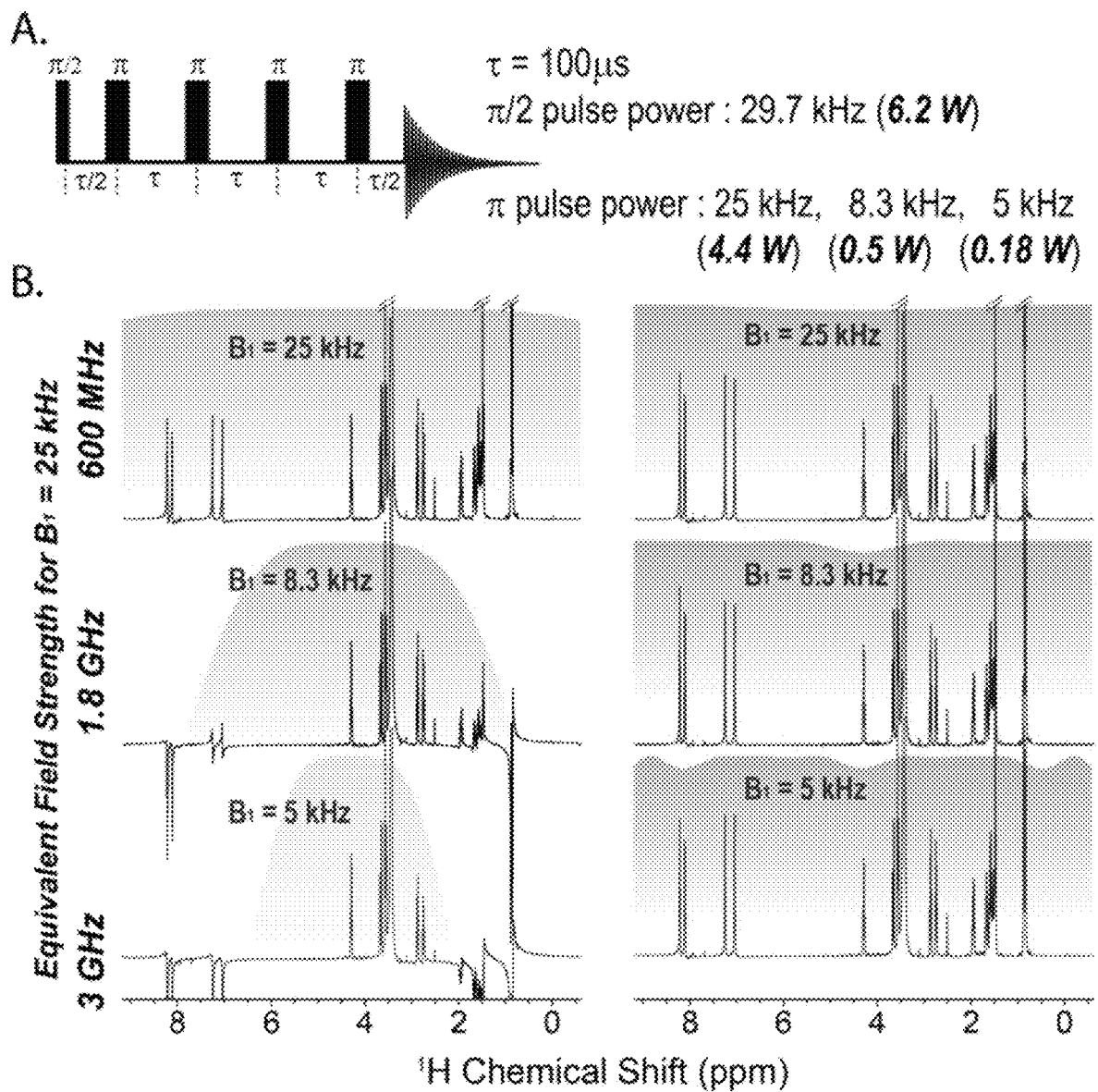
FIGS. 17A-17B show an example of a pulse sequence (FIG. 17A) that can be used for evaluating the performance of inversion pulses at various RF powers (25 kHz, 8.3 kHz, and 5 kHz). The same phase was used for all $\pi$ pulses.

In an example study, to demonstrate the performance of ULP pulses generated using the methods described in the present disclosure, the frequency response of a sequence of four refocusing n pulses at various RF powers was studied, as shown in FIGS. 17A and 17B. It is noted that reducing RF power corresponds to increasing the field strength. For this example, the relaxation losses due to pulse lengths were considered as negligible. If the spectral width at $B_0$ is $\Delta\omega_{B_0}$ (in Hz), at a different field magnetic field, $B'_0$, the spectral width scales according to, $$\Delta\omega_{B'_0} = \left(\frac{B'_0}{B_0}\right) \times \Delta\omega_{B_0}. \tag{7}$$

Also, the excitation bandwidth of a RF pulse with power $B_1$ can be written as $\Delta\omega_{B_1}$. By changing the RF power ($B'_1$), the excitation bandwidth scales according to, $$\Delta\omega_{B'_1} = \left(\frac{B'_1}{B_1}\right) \times \Delta\omega_{B_1}. \tag{8}$$

From Eqns. (7) and (8), it can be seen that to maintain the same spectral bandwidth, RF power must be scaled with the ratio $B'_0/B_0$. Therefore, the performance of a pulse at higher fields can be simulated by decreasing RF power in the same $B_0$ field. FIGS. 17A-17B show the performance of consecutive n pulses for classical hard RF and ULP pulses designed with GENETICS at different RF powers. The bandwidths of the pulses are compared for standard NMR spectrometers (600 MHz) and ultra-high-field spectrometers (e.g., up to 3 GHz). It is noted that at low magnetic field strengths the performance of classical hard pulses and ULP pulses is comparable. However, for higher fields and UHF, the ULP pulse performance is superior, eliminating both phase distortions and losses of signal intensity caused by the side bands generated by hard RF pulses.

A notable problem for spectroscopy of biomolecules at high fields is the efficient suppression of the water signal without the introduction of spectral artifacts. Concomitant to the increase of static magnetic field is the increase of the radiation damping. Radiation damping causes the water peak to broaden out and introduces artifacts into the transformed spectra.

Figure 18:
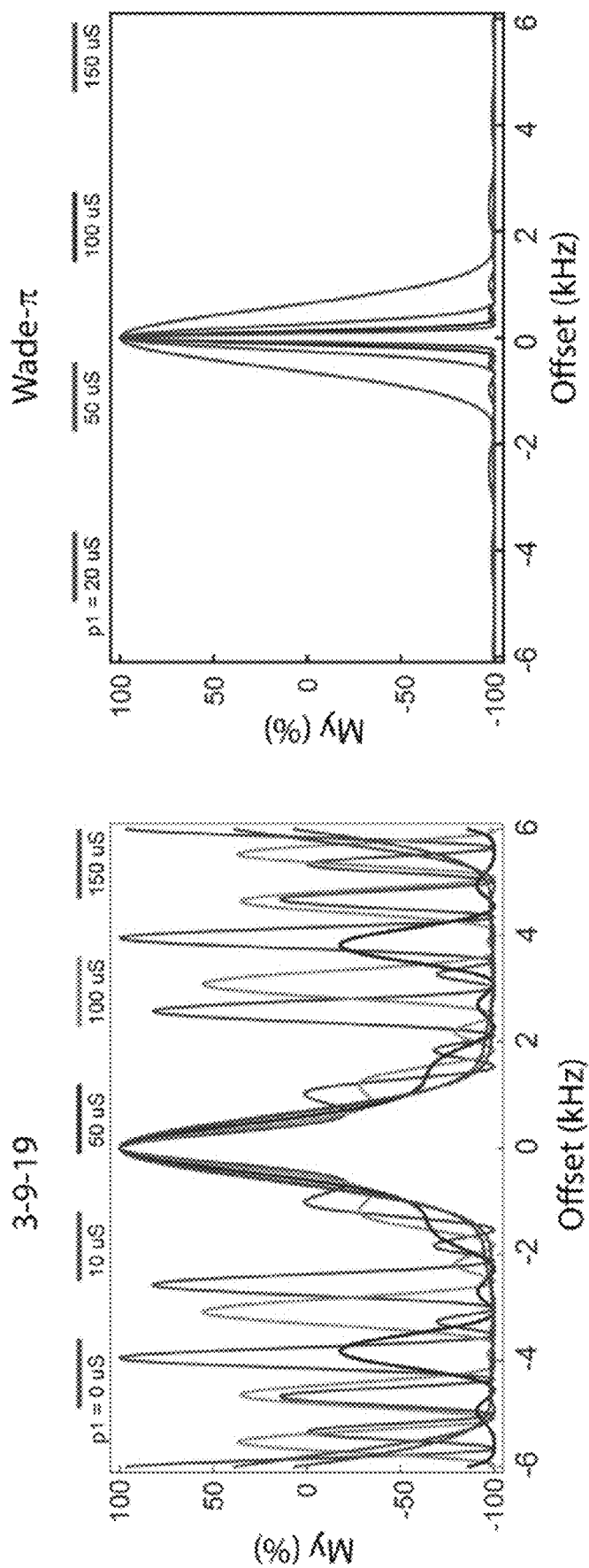
FIG. 18 shows comparison of 3-9-19 (left) and WADE (right) water suppression as function of RF power (or p1 pulse length). Selectivity is increased for WADE. Total pulse length of WADE at p1=20 μs is 1041.082 μs whereas the length of 3-9-19 is 800 μs.

To overcome this problem, an excitation profile that de-selects the water signal and at the same time excites both high-field and low-field resonances can be generated using the methods described in the present disclosure. Such pulses can be referred to as water de-selective excitation ("WADE") pulses. Unlike previously published pulse schemes for water suppression (e.g., 3-9-19 and excitation sculpting), the profile of the WADE pulse can be evolved using an optimal phase surface and has a significantly more homogeneous excitation profile for resonances at both high and low fields from the water signal. In contrast, the other commonly used water suppression profiles display severe side bands that often jeopardize signal detection, as shown in FIG. 18. In addition to the more homogenous excitation profile, the bandwidth of the WADE pulse extends far beyond the values of 3-9-19 and excitation sculpting, making it possible to apply the WADE pulse at UHF.

Figure 19:
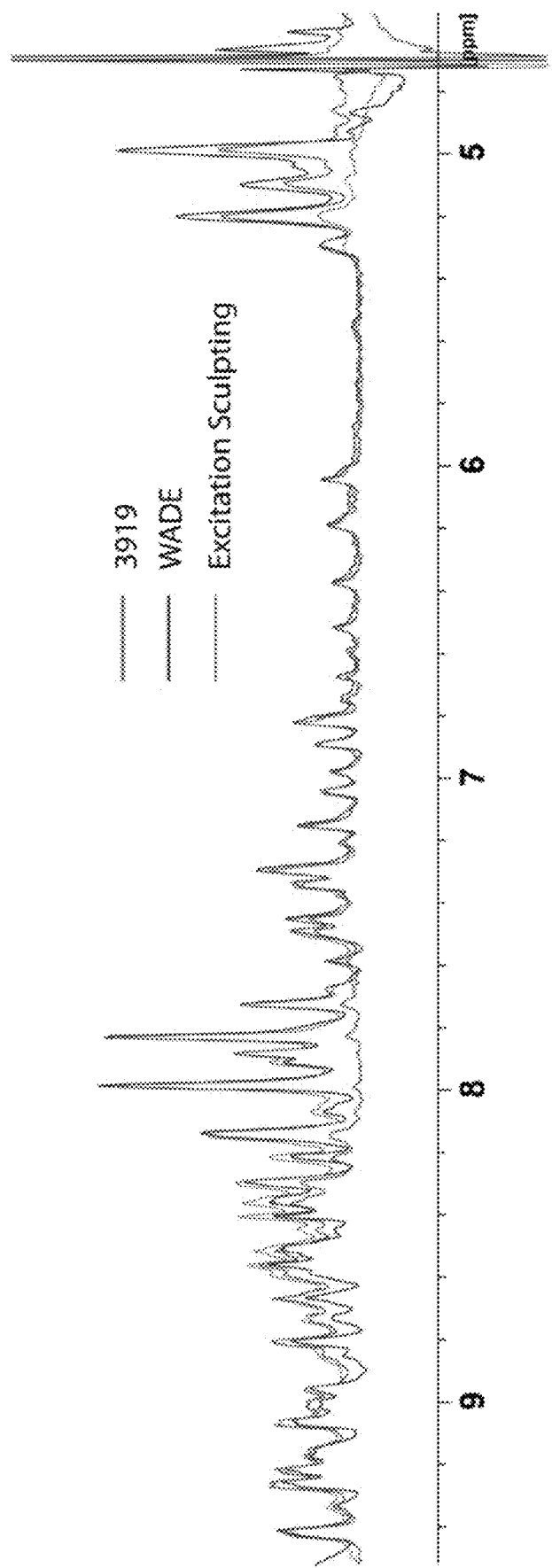
FIG. 19 shows an overlay of 1D $^1$H NOESY spectra of ubiquitin (K48C) recorded at 600 MHz using various water suppression schemes, i.e., 3919 (red), WADE (blue), and Excitation Sculpting (green).

As an example, the amide regions of the 1D NOESY spectra of ubiquitin were obtained using three different water suppression schemes. As shown in FIG. 19, the cleanest excitation profile across the chosen bandwidth is obtained with WADE (blue spectrum). The WADE pulse is composed of a single triply compensated pulse that includes the refocusing of heteronuclear J-evolution. The implementation on current spectrometers is straightforward. Additional WADE pulses can be designed with different excitation angles such as WADE-π and WADE-π/2. Unlike other water suppression sequences, WADE-π/2 does not require gradients, which makes it feasible for water suppression in solid-state NMR probes that are generally not equipped with gradient coils.

Figure 20:
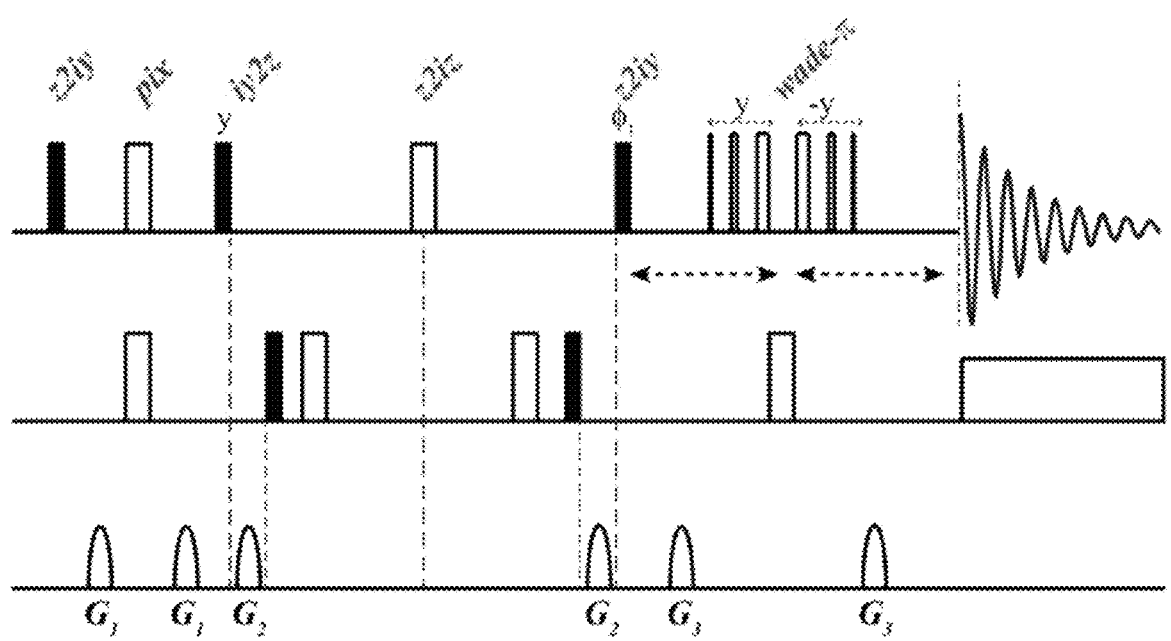
FIG. 20 shows an example of an ultra-low power fast HSQC (ULP-FHSQC) pulse sequence. The pulse sequence avoids water saturation by keeping its magnetization along the z-direction. Any residual water is removed by the WADE-$\pi$ with G3 gradients.

Heteronuclear experiments are the most common application of NMR to resolve the resonances of nuclear spin systems in several dimensions. Popular applications include resolving resonances of organic molecules and biomolecules. To demonstrate the performance of GENETICS in designing ULP complex pulse sequences, a heteronuclear $^1$H-$^{15}$N Fast HSQC (FHSQC) experiment was redesigned using ULP pulses generated in accordance with the methods described in the present disclosure. The FHSQC experiment provides biomolecular fingerprints routinely used for structural characterization, monitoring biochemical events, and drug discovery. The new pulse sequence (ULP-FHSQC) is shown in FIG. 20.

As a first step, the minimum pulse operations required for the experiment were identified and the maximum power requirement for the proton channel was reduced. Subsequently, the WADE pulse was included for water suppression. In order to obtain a time-optimal FHSQC experiment, the pulses were designed to carry out the desired operations only on the spectral region of the amide fingerprint, with the water signal on resonance.

All the GENTICS-derived RF pulses used in this example ULP-FHSQC sequence were designed to have a minimum fidelity of 99.9% over the specified bandwidth and RF inhomogeneity compensation of ±5%. As for all of the triply compensated pulses, there was no J-coupling evolution during the pulse execution. All the proton pulses were amide selective pulses acting in the middle of amide protons except for the WADE-π pulse. The amide spectral selection was encoded in the phases of the RF shapes and did not require any offset adjustments. Along with the amide protons, these pulses affect the water peak with the desired operator, which tracks the water magnetization and its suppression before acquisition.

Figure 21:
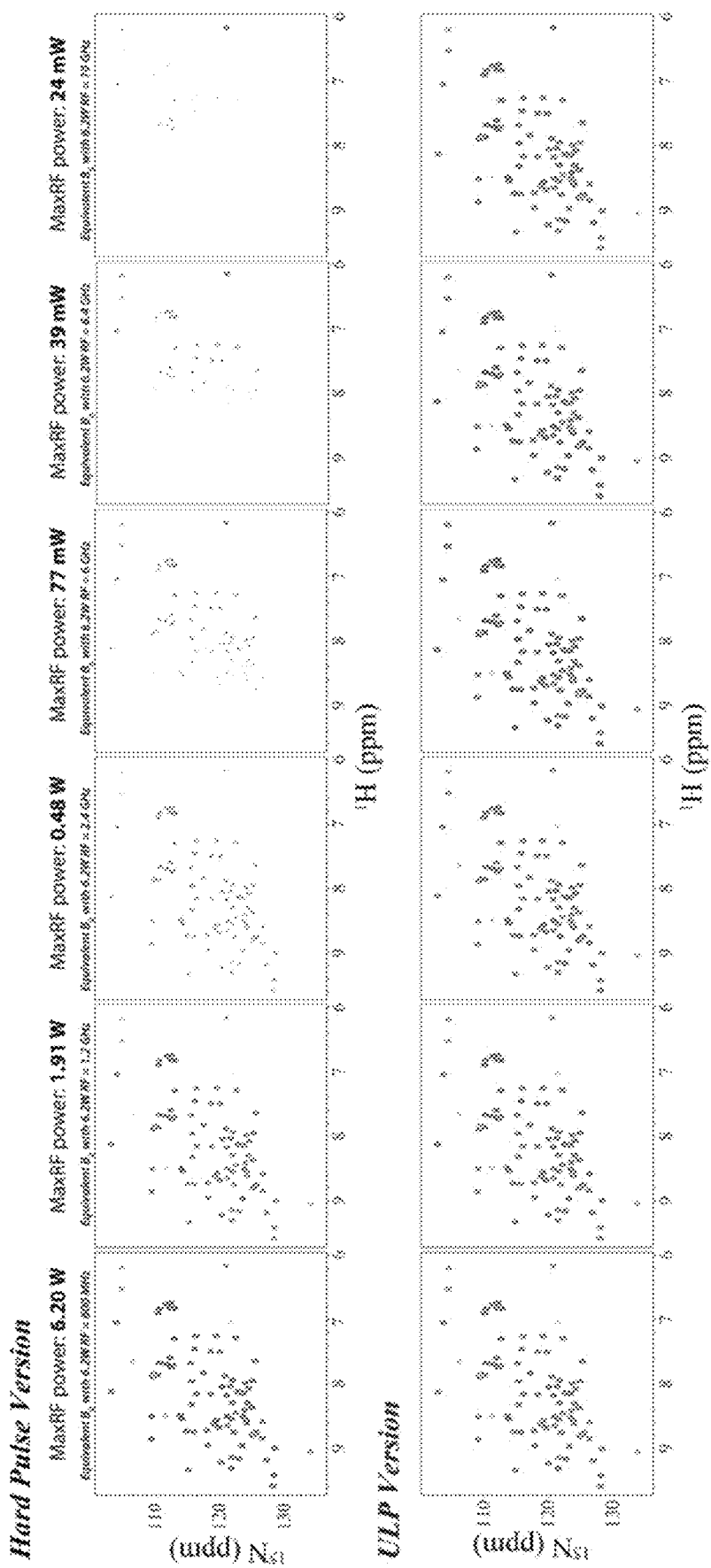
FIG. 21 shows a comparison of $^{15}$N-$^1$H ubiquitin HSQC spectra with classical and ULP pulses. The Bruker standard FHSQC (black) and ULP-FHSQC (blue) recorded on $^{15}$N labeled Ubiquitin (K48C) at various $^1$H power. The ULP-FHSQC is able to record good quality spectra even at ¹⁄₂₅₀ of the power of the Bruker standard FHSQC. These experiments were performed on a 600 MHz Bruker NEO spectrometer. The regular FHSQC uses the maximum power of 6.2 W on the proton channel. In contrast, the new ULP-FHSQC used a reduced proton power of ~24 mW, which is ~250 times lower.
Figure 22:
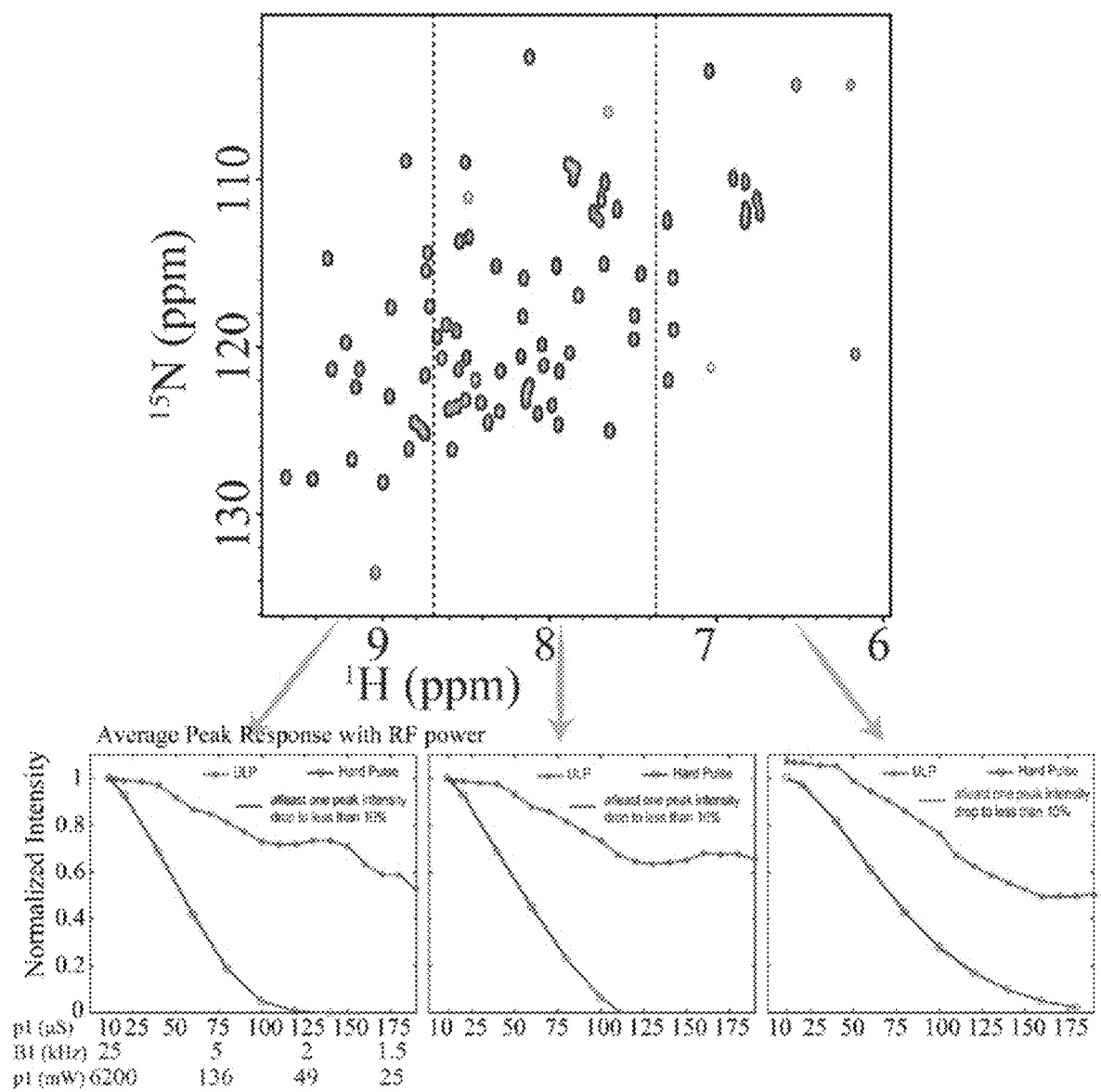
FIG. 22 shows $^1$H-$^{15}$N ULP-FHSQC spectra of ubiquitin (top) and plots of the variation of average peak intensity as a function of the RF power shown for three different regions in the proton dimension (bottom).

A comparison of the hard and ULP pulses performances is shown in FIG. 21. Upon decreasing the RF power, the hard pulse version of FHSQC results in a significantly limited excitation bandwidth, leading to severe phase distortions and missing peaks. In contrast, the ULP-FHSQC enables the recording of high quality spectra, even at 24 mW, which is ~250 times lower than the standard pulses. It is noted that at high RF power, the ULP-HSQC performance is still superior to the hard pulses as the spectra are recorded with significantly higher sensitivity than the standard high-power version. The intensity of regular FHSQC falls to less than 10% at 136 mW, whereas the ULP-FHSQC retains more than 80% of the signal intensity, as shown in FIG. 22. This minimal loss may be due to relaxation and is negligible in most cases. Importantly, ULP RF pulses can be used in most of the triple resonance experiments that are common in the field of structural biology, including HNCA, HNCO, HNCACO, HNCOCA, and so on.

Entanglement is an important resource for quantum information processing. Using the GENETICS technique described in the present disclosure, a pulse sequence that enables a robust spin entanglement for reliable quantum computing can be created.

Starting from a |00⟩ state, the robust entangler creates high-fidelity entangled state $1/\sqrt{2} \times (|00\rangle + |11\rangle)$ for a range of J-coupling in the presence of RF inhomogeneity and finite pulse effects. As shown in FIGS. 23A-D, an entangler pulse sequence created in this manner was experimentally verified using $^{13}$C-labelled chloroform, where $^{13}$C and $^1$H form a two-qubit system with J-coupling 209 Hz.

Figures 23A, 23B, 23C, 23D:
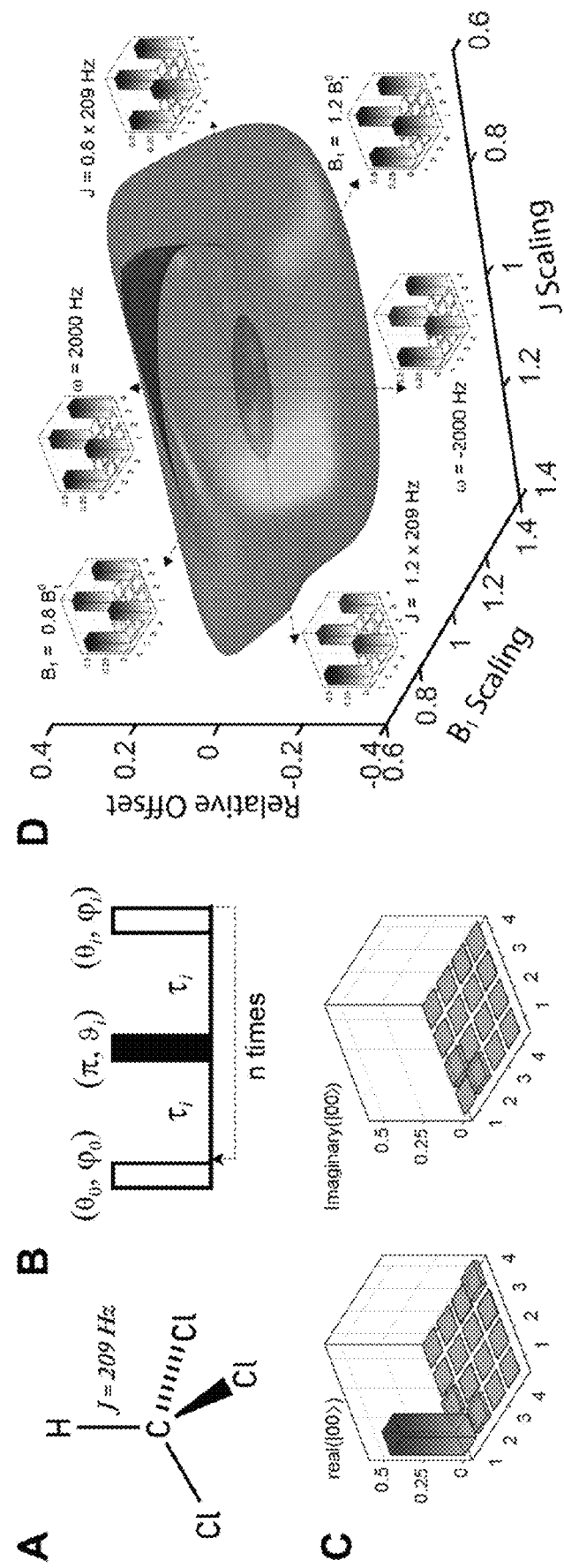
FIGS. 23A-23D show an example of an entangler pulse sequence created in this manner was experimentally verified using $^{13}$C-labelled chloroform, where $^{13}$C and $^1$H form a two-qubit system with J-coupling 209 Hz.
Figure 24:
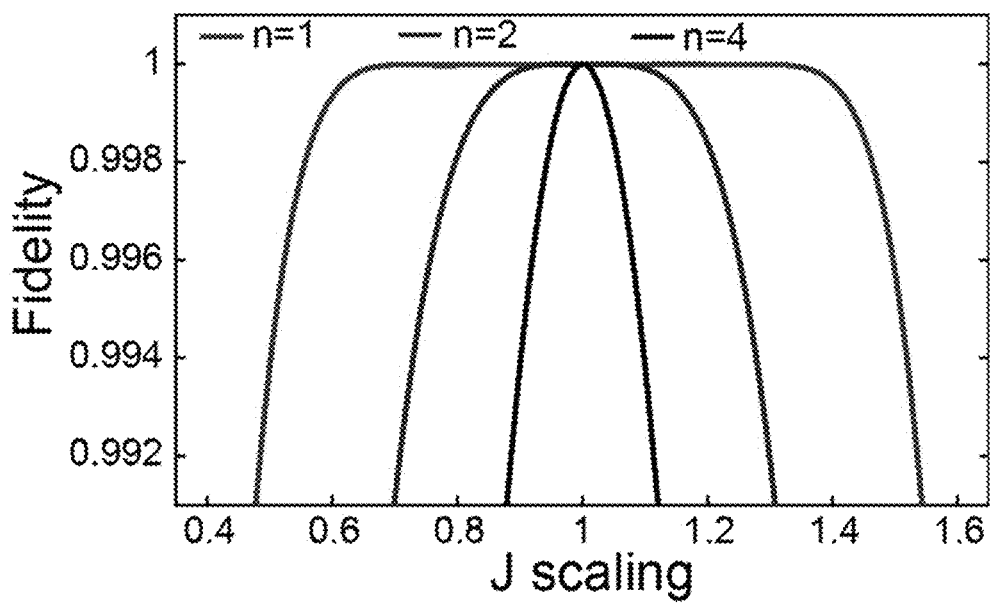
FIG. 24 shows the fidelity response with J-coupling for a robust entangler pulse sequence shown in FIG. 23B.

FIG. 23A shows a $^{13}$C-labelled chloroform. FIG. 23B shows an entangling pulse sequence with J-compensation. The compensation level changes with n, as shown in FIG. 24. The values of flip angles and phases for n=1, 2, and 4, are given in Table 1 below. FIG. 23C shows a quantum state tomography after creating a |00⟩ pseudopure state. FIG. 23D shows the fidelity volume of the robust entangler (black surface) with experimental imperfections on J-coupling, RF field strength, and offset for the n=2 case. The red surface in FIG. 23D shows the fidelity volume of the entangler with hard pulses.

The flip angles and phase for this example robust entangling pulse sequence as generated by GENETICS were as follows:

TABLE 1 n = 1

$\theta_0 = 1.5708$, $\varphi_0 = 3.1416$, $\vartheta = 0$, $\theta_i = 2.0944$, $\varphi_i = 0.6155$,
$\tau_i = [0.25\ 0.25]/J$ n = 2

$\theta_0 = 1.5708$, $\varphi_0 = 1.3090$, $\vartheta_i = 0.7854\ 0.7854$, $\theta_i = 1.0472\ 1.5708$,
$\varphi_i = 1.8326\ 1.3090$, $\tau_i = [0.2491\ 0.2491\ 0.4982\ 0.4982]/J$ n = 4

$\theta_0 = 1.5708$, $\varphi_0 = 1.5725$, $\vartheta_i = 2.0106\ 0.2042\ 3.0247\ 1.3422$
$\theta_i = 1.9356\ 0.6266\ 2.4976\ 0.6248$, $\varphi_i = 0.8954\ 2.9479\ 1.4748\ 1.6703$
$\tau_i = [0.2470\ 0.2470\ 0.4939\ 0.4939\ 0.4946\ 0.4946\ 0.4944\ 0.4944]/J$ Some of the advantages of this new approach include: it uses only global pulses without the need of spin selective pulses; there is a simultaneous compensation for all the experimental errors; and the compensation levels are tunable by adjusting the appropriate parameters.

Figure 25:
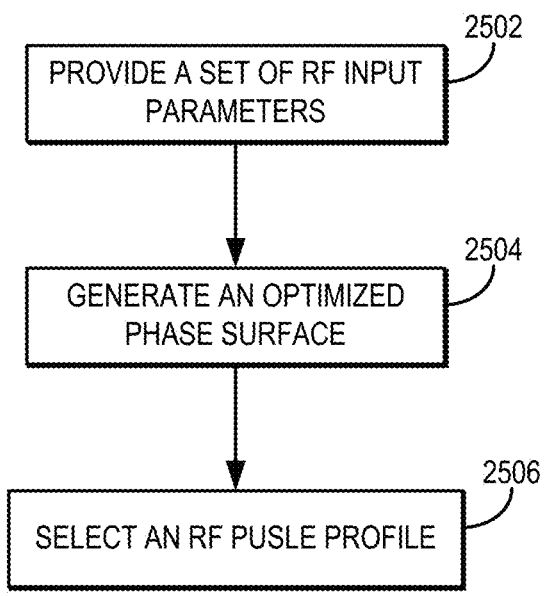
FIG. 25 is a flowchart setting forth the steps of an example method for producing one or more radio frequency ("RF") pulses according to one aspect of the present disclosure.

Referring now to FIG. 25, a flowchart is illustrated as setting forth the steps of an example method for producing an RF pulse profile from an optimal phase surface according to one aspect of the present disclosure. The method includes providing a set of RF input parameters to a computer system, as indicated by step 2502. The RF input parameters may then be used to generate an optimal phase surface, as indicated at step 2504. For instance, the optimal phase surface can be generated by iteratively updating an initial RF pulse profile based at least in part on the set of RF input parameters, as described above. In general, the optimal phase surface contains a series of RF pulse shapes generated at each iterative step with different RF pulse characteristics, such as bandwidth, RF inhomogeneity compensation, or other RF input parameters. The computer system may then select an RF pulse profile from the optimal phase surface, as indicated at step 2506. As one example, the RF pulse profile may be selected based on a selection of RF input parameters in the set of RF input parameters associated with a desired characteristic of the RF pulse profile. The RF pulse profile may be selected, for instance, using the UPF module described above.

Figure 26:
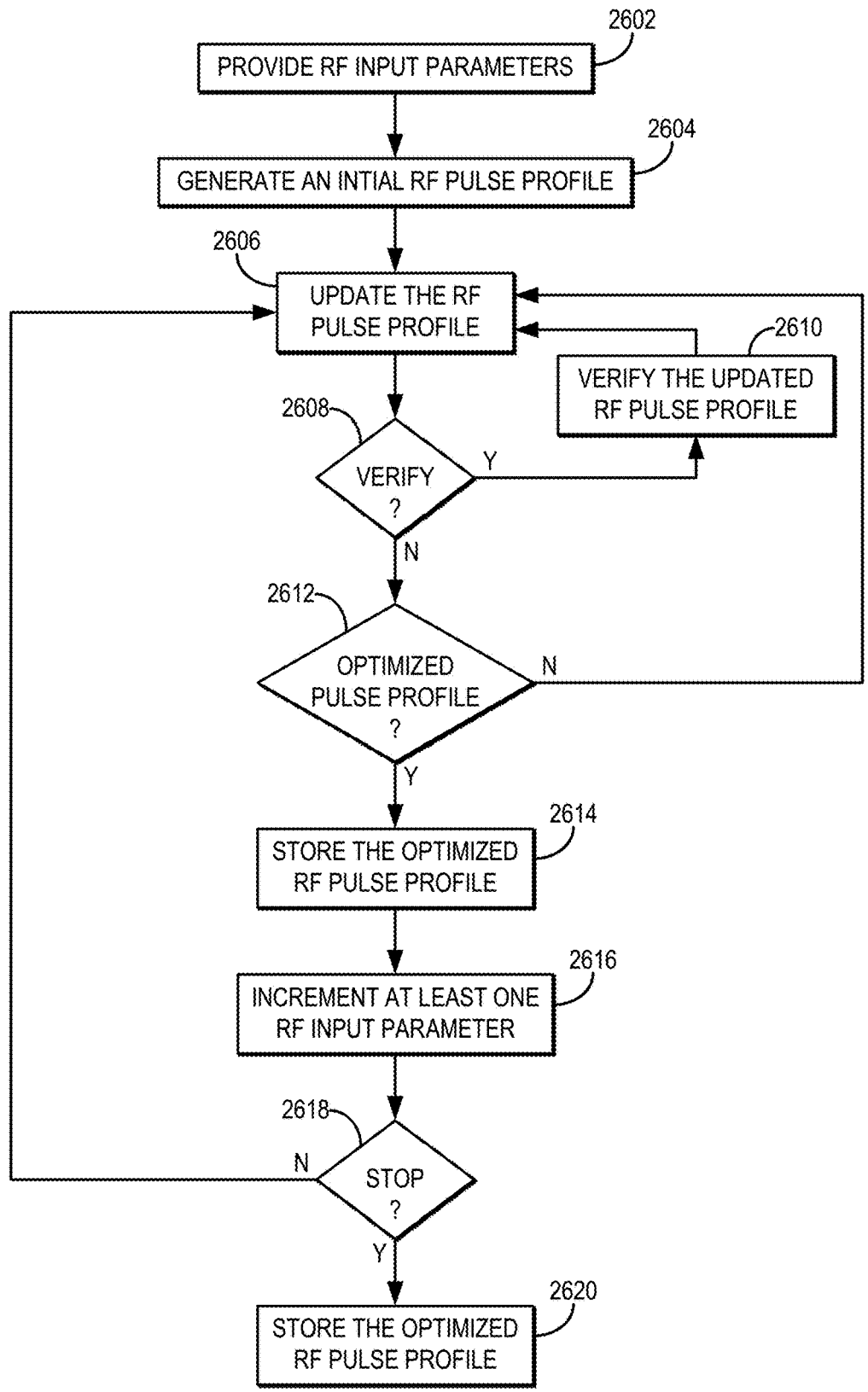
FIG. 26 is a flowchart setting forth the steps of an example method for producing an optimal phase surface according to one aspect of the present disclosure.

Referring now to FIG. 26, a flowchart is illustrated as setting forth the steps of an example method for producing an optimal phase surface according to one aspect of the present disclosure, which may implement the IFSA and ISCA modules described above. The method includes providing a set of RF input parameters to a computer system, as indicated by step 2602. Providing the set of RF input parameters can include retrieving a set of RF input parameters from a memory or other data storage. In other examples, providing the set of RF input parameters can include a user inputting or otherwise selecting the set of RF input parameters. Suitable RF input parameters may include a total nutation angle, RF bandwidth values, a RF inhomogeneity compensation range, a set of values indicating an RF pulse shape, RF pulse length, a set of values associated with a selectivity of each different RF pulse profile, a set of values relating to Bloch sphere components, and the like.

The computer system may then generate an initial pulse profile based at least in part on the set of RF input parameters, as indicated at step 2604. In some aspects, the initial pulse profile is generated using a numerical optimization algorithm. In one non-limiting example, the numerical optimization algorithm includes a Broyden-Fletcher-Goldarb-Shanno ("BFGS") algorithm. The initial RF pulse profile may then be iteratively updated by changing at least one of the RF input parameters to generate an additional RF pulse profile in the phase surface, as indicated at step 2606. In some aspects, the updated RF pulse profile determined by the numerical optimization algorithm may be validated after a number of iterations using an evolutionary algorithm at step, as indicated at decision block 2608 and step 2610. The evolutionary algorithm may implement a genetic algorithm. In one non-limiting example, the number of iterations includes at most 100 iterations. The optimized RF pulse profile may be selected from the updated candidates when an updated RF pulse profile exceeds a user-defined fidelity, as indicated by decision block 2612.

The optimized RF pulse profile may be stored within the computer system in a memory cache, as indicated at step 2614. At least one of the RF input parameters may be incremented, as indicated at step 2616, and the method may be repeated to generate another optimized RF pulse profile based on the at least one incremented RF input parameters. In some aspects, the generation of the optimal phase surface is completed when incrementing the at least one of the RF input parameters results in a RF input parameter exceeding a user-defined set point, as determined at decision block 2618. The optimized RF pulse profile is then stored, as indicated at step 2620.

Figure 27:
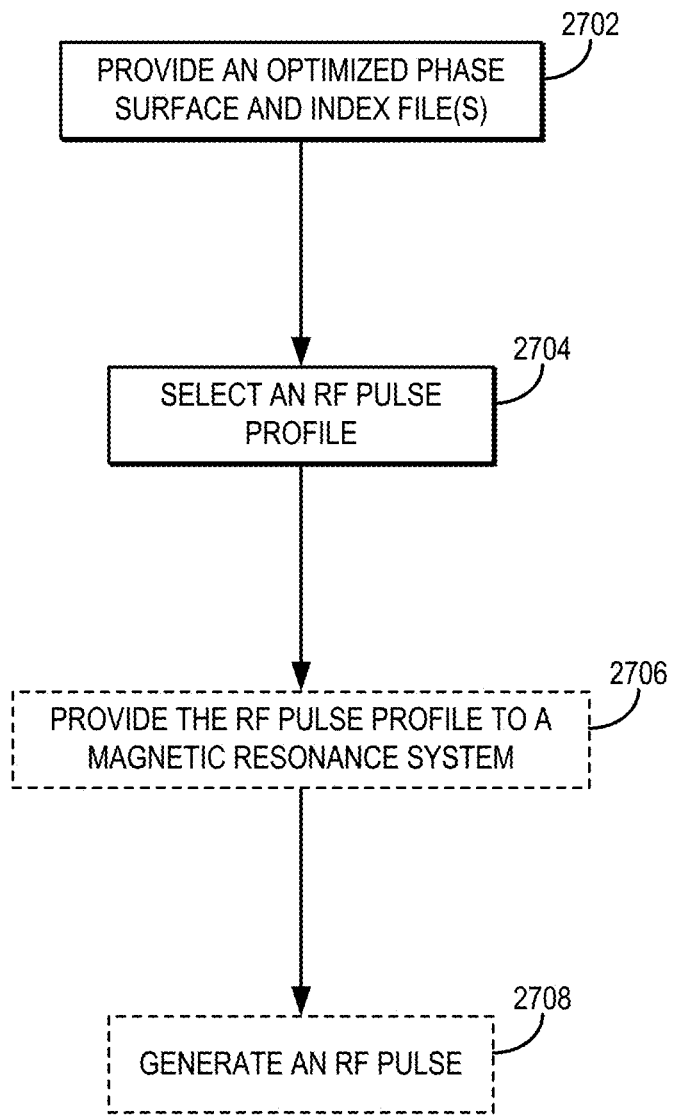
FIG. 27 is a flowchart setting forth the steps of an example method for selecting an RF pulse profile from an optimal phase surface according to one aspect of the present disclosure.

Referring now to FIG. 27, a flowchart is illustrated as setting forth the steps of an example method for selecting an RF pulse profile from an optimal phase surface according to one aspect of the present disclosure. The method, which may implement the UPF module described above, includes providing an optimal phase surface and CIA files 2702 to a computer system. The optimal phase surface and CIA files may be generated by the computer system or obtained through an external or internal network. The computer system may then select an RF pulse profile 2704 based on a selection of RF input parameters associated with user desired characteristics. In some aspects, the generation of the RF pulse profile from the optimal phase surface takes less than 2 seconds. In an optional step, the computer system may provide the RF pulse profile to an NMR system 2706. The NMR system may then generate an RF pulse based on the RF pulse profile, as indicated at step 2708. In some aspects, the NMR system can be an NMR spectroscopy system. In other aspects, the NMR system can be an MRI system.

The systems and method of the present disclosure may generate an optimized RF pulse profile for operations such as broadband excitation and inversion, selective excitation and inversion, any angle broadband pulse, and excitation and inversion pulses with reduced RF power dependency. The optimized RF pulse profiles of the present disclosure may have time durations optimal for any specified bandwidth. The generated optimized RF pulse profiles may have high-fidelity operation within the given bandwidth. In some aspects, fidelity operation is greater than 99.8%.

An important consideration in the selection of RF pulse shapes using the methods described in the present disclosure is the analysis of the OPS maps. In the methods described above, this task can be accomplished by the CIA routine. Alternatively, a suitably trained neural network can be implemented to generate RF pulse shapes from the OPS maps. This artificial intelligence-based process can be referred to as a "PhaseNET" neural network. As a general example, PhaseNET is trained on the previously generated OPS data and predicts new RF shapes with higher fidelity in a few milliseconds.

Figure 28:
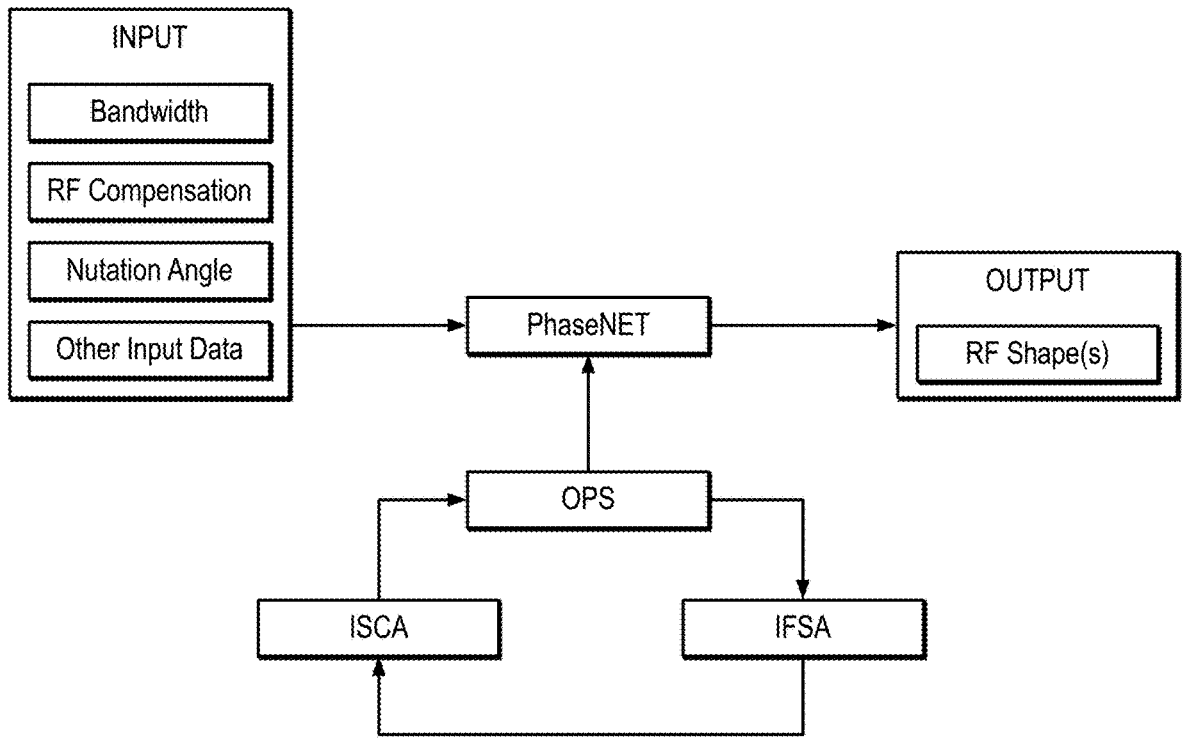
FIG. 28 is a workflow implementing a PhaseNET neural network for generating RF pulse profile data from input OPS data and RF pulse parameter data.
Figure 29:
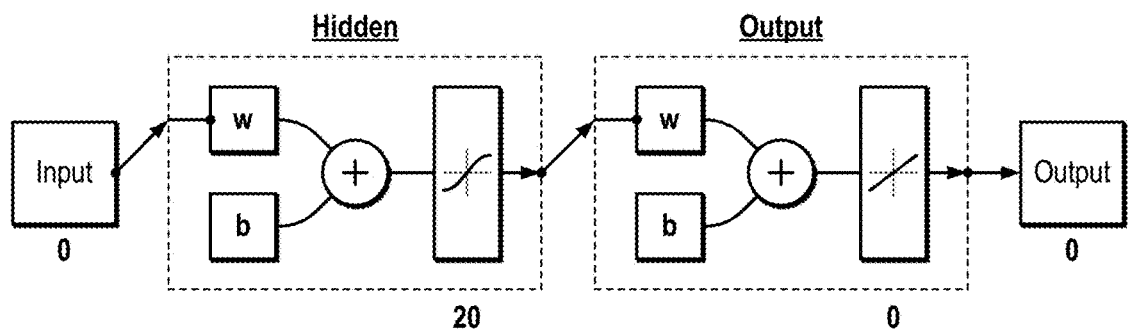
FIG. 29 is an example of a neural network architecture that may be implemented for a PhaseNET neural network.

PhaseNET is a neural network that can be trained on OPS data generated by the ISCA and IFSA algorithms described above. In this way, the PhaseNET learns from the OPS data and can be implemented to predict new RF shapes that may not otherwise be directly available from the OPS data. A general workflow for implementing a PhaseNET process is shown in FIG. 28. In addition to OPS data, RF pulse parameter data, such as bandwidth, RF compensation, and/or nutation angle data can be input to the PhaseNET. These RF pulse parameter data may be selected or otherwise defined by a user, or can be initialized or selected based on other criteria. These RF pulse parameters are then analyzed by PhaseNET, which generates new RF shapes that may be optimized relative to a selected parameter, such as optimized for time or power. An example network architecture that can be implemented for a PhaseNET is shown in FIG. 29.

Figure 30:
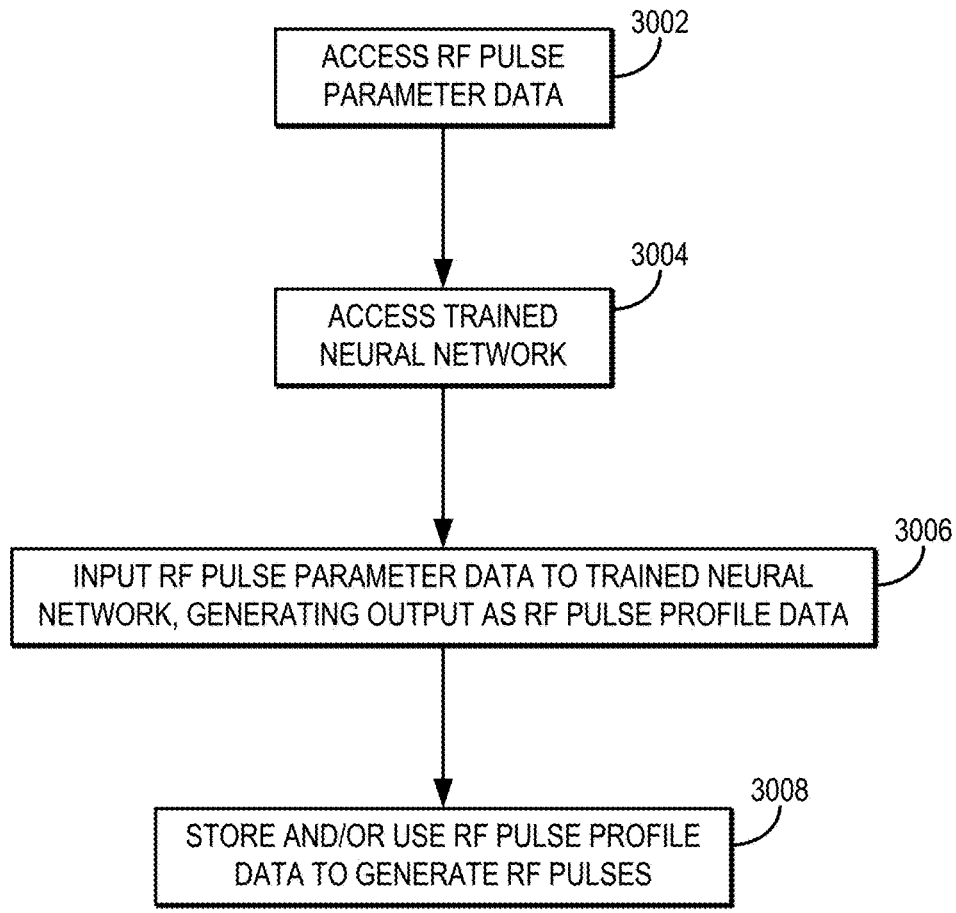
FIG. 30 is a flowchart setting forth the steps of an example method for using a PhaseNET neural network to generate RF pulse profile data from RF pulse parameter data.

Referring now to FIG. 30, a flowchart is illustrated as setting forth the steps of an example method for producing an RF pulse profile from an optimal phase surface using a suitably trained neural network or other machine learning algorithm.

The method includes accessing RF pulse parameter data, as indicated at step 3002. Accessing the RF pulse parameter data may include retrieving such data from a memory or other suitable data storage device or medium. Alternatively, accessing the RF pulse parameter data may include receiving such data via user selection or input. As described above, the RF pulse parameter data can include bandwidth data, RF pulse compensation data, nutation angle data, other RF pulse parameter data, and/or combinations thereof.

A trained neural network (or other suitable machine learning algorithm) is then accessed with the computer system, as indicated at step 3004. Accessing the trained neural network may include accessing network parameters (e.g., weights, biases, or both) that have been optimized or otherwise estimated by training the neural network on training data. In some instances, retrieving the neural network can also include retrieving, constructing, or otherwise accessing the particular neural network architecture to be implemented. For instance, data pertaining to the layers in the neural network architecture (e.g., number of layers, type of layers, ordering of layers, connections between layers, hyperparameters for layers) may be retrieved, selected, constructed, or otherwise accessed. In general, the neural network is trained, or has been trained, on training data in order to generate one or more RF pulse shapes based on input OPS and RF pulse parameter data.

The RF pulse parameter data are then input to the one or more trained neural networks, generating output as RF pulse profile data, as indicated at step 3006. For example, the RF pulse profile data may include one or more RF pulse shapes that have been optimized based on one or more parameters, including time and/or power.

The RF pulse profile data generated by inputting the RF pulse parameter data to the trained neural network(s) can then be stored for later use or transferred or otherwise communicated to a magnetic resonance system (e.g., an NMR system, an MRI system) further use in generating RF pulses, or both, as indicated at step 3008.

As described above, in some implementations the RF pulse profile data can be used in a quantum compiler. For instance, the methods described in the present disclosure can be used to generate high-fidelity machine implementable code (e.g., an RF pulse sequence based in part on RF pulse profile data) for any unitary operation, and such code can be generated in a manner of a few milliseconds. This process can be extended for a sequence of unitary operations that forms a quantum algorithm. This concept of translating a custom unitary operation into a machine language can be applied to other implementations of quantum computing.

In other implementations, the RF pulse profile data can be used to define RF pulses for use in MRI. For instance, the RF pulse profile data can define RF pulses that are tuned to specific cases (e.g., a specific MRI scanner, a specific RF coil, a particular subject, or combinations thereof), which can improve the resulting image sensitivity.

In still other implementations, the RF pulse profile data can be used for high-resolution NMR applications. RF pulses used in most NMR pulse sequences have fixed bandwidth ($\omega/B_1$) and inhomogeneity compensation; however, the RF pulse profile data generated using the techniques described in the present disclosure can contain RF pulses that have been designed for specific experiments and/or samples such that the RF pulses are tuned for required bandwidth/inhomogeneity compensation, which reduces the length of the pulses and improves the sensitivity.

Figure 31:
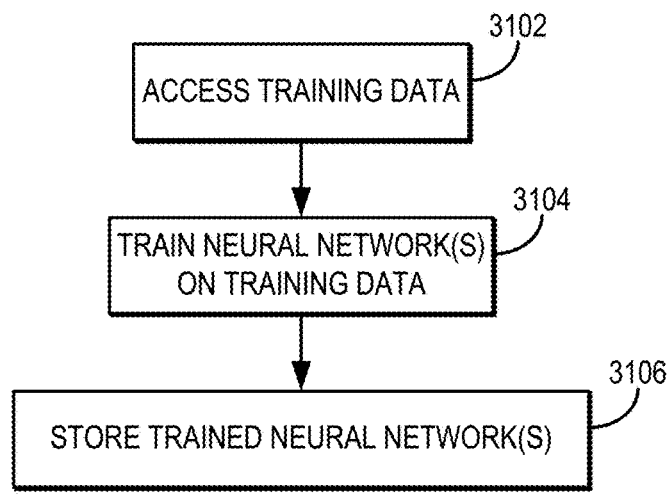
FIG. 31 is a flowchart setting forth the steps of an example method for training a PhaseNET neural network.

Referring now to FIG. 31, a flowchart is illustrated as setting forth the steps of an example method for training one or more neural networks (or other suitable machine learning algorithms) on training data, such that the one or more neural networks are trained to receive input as OPS data and RF pulse parameter data in order to generate output as RF pulse profile data.

In general, the neural network(s) can implement any number of different neural network architectures. For instance, the neural network(s) could implement a convolutional neural network, a residual neural network, and so on. In some instances, the neural network(s) may implement deep learning and/or transfer learning. An example of a neural network architecture that can be implemented is shown in FIG. 29.

Alternatively, the neural network(s) could be replaced with other suitable machine learning algorithms, such as those based on supervised learning, unsupervised learning, deep learning, ensemble learning, dimensionality reduction, and so on.

The method includes accessing training data with a computer system, as indicated at step 3102. Accessing the training data may include retrieving such data from a memory or other suitable data storage device or medium. Alternatively, accessing the training data may include generating such data using the methods described in the present disclosure, such as using an ISCA and IFSA module, and transferring or otherwise communicating the data to the computer system.

In general, the training data can include OPS data that have been generated using the ISCA and IFSA modules described above. As one non-limiting example, the training data may include a database of a large number of RF shapes (e.g., approximately 200,000) generated using the ISCA and IFSA algorithms within GENETICS. As another non-limiting example, the training data may include OPS data with variable flip angles and a specified bandwidth.

One or more neural networks (or other suitable machine learning algorithms) are then trained on the training data, as indicated at step 3104. In general, the neural network can be trained by optimizing network parameters (e.g., weights, biases, or both) based on minimizing a loss function. As one non-limiting example, the loss function may be a mean squared error loss function.

Training a neural network may include initializing the neural network, such as by computing, estimating, or otherwise selecting initial network parameters (e.g., weights, biases, or both). Training data can then be input to the initialized neural network, generating output as RF pulse profile data. The quality of the output data can then be evaluated, such as by passing the output data to the loss function to compute an error. The current neural network can then be updated based on the calculated error, such as by using backpropagation methods based on the calculated error. As one non-limiting example, a conjugate gradient backpropagation with Polak-Ribiére updates can be used. The current neural network can be updated by updating the network parameters (e.g., weights, biases, or both) in order to minimize the loss according to the loss function. When the error has been minimized (e.g., by determining whether an error threshold or other stopping criterion has been satisfied), the current neural network and its associated network parameters represent the trained neural network.

The one or more trained neural networks are then stored for later use, as indicated at step 3106. Storing the neural network(s) may include storing network parameters (e.g., weights, biases, or both), which have been computed or otherwise estimated by training the neural network(s) on the training data. Storing the trained neural network(s) may also include storing the particular neural network architecture to be implemented. For instance, data pertaining to the layers in the neural network architecture (e.g., number of layers, type of layers, ordering of layers, connections between layers, hyperparameters for layers) may be stored.

Figure 32:
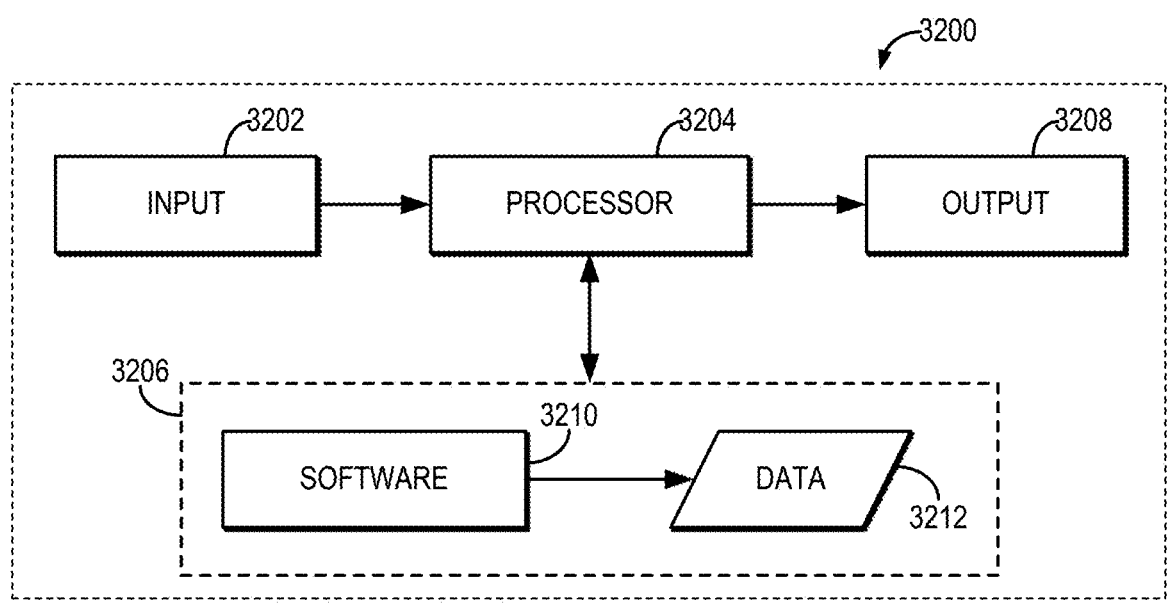
FIG. 32 is a block diagram of an example computer system that can implement the methods described in the present disclosure.

Referring now to FIG. 32, a block diagram of an example of a computer system 3200 that can perform the methods described in the present disclosure is shown. The computer system 3200 generally includes an input 3202, at least one hardware processor 3204, a memory 3206, and an output 3208. Thus, the computer system 3200 is generally implemented with a hardware processor 3204 and a memory 3206.

In some embodiments, the computer system 3200 can be a workstation, a notebook computer, a tablet device, a mobile device, a multimedia device, a network server, a mainframe, one or more controllers, one or more microcontrollers, or any other general-purpose or application-specific computing device.

The computer system 3200 may operate autonomously or semi-autonomously, or may read executable software instructions from the memory 3206 or a computer-readable medium (e.g., a hard drive, a CD-ROM, flash memory), or may receive instructions via the input 3202 from a user, or any another source logically connected to a computer or device, such as another networked computer or server. Thus, in some embodiments, the computer system 3200 can also include any suitable device for reading computer-readable storage media.

In general, the computer system 3200 is programmed or otherwise configured to implement the methods and algorithms described in the present disclosure. For instance, the computer system 3200 can be programmed to design and select RF pulses as described in the present disclosure. For instance, the computer system 3200 can be programmed to implement the IFPA, ISCA, CIA, and UPF modules described above.

The input 3202 may take any suitable shape or form, as desired, for operation of the computer system 3200, including the ability for selecting, entering, or otherwise specifying parameters consistent with performing tasks, processing data, or operating the computer system 3200. In some aspects, the input 3202 may be configured to receive data, such as initial RF parameter values. Such data may be processed as described above to generate and select RF pulses. In addition, the input 3202 may also be configured to receive any other data or information considered useful for designing and selecting RF pulses using the methods described above.

Among the processing tasks for operating the computer system 3200, the one or more hardware processors 3204 may also be configured to carry out any number of post-processing steps on data received by way of the input 3202.

The memory 3206 may contain software 3210 and data 3212, such as initial RF parameter values, and may be configured for storage and retrieval of processed information, instructions, and data to be processed by the one or more hardware processors 3204. In some aspects, the software 3210 may contain instructions directed to implementing the IFPA, ISCA, CIA, and UPF modules described above for designing and selecting RF pulses.

In addition, the output 3208 may take any shape or form, as desired, and may be configured for displaying RF pulse shapes, in addition to other desired information.

In some embodiments, any suitable computer-readable media can be used for storing instructions for performing the functions and/or processes described herein. For example, in some embodiments, computer-readable media can be transitory or non-transitory. For example, non-transitory computer-readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read-only memory ("EPROM"), electrically erasable programmable read-only memory ("EEPROM")), any suitable media that is not fleeting or devoid of any semblance of permanence during transmission, and/or any suitable tangible media. As another example, transitory computer-readable media can include signals on networks, in wires, conductors, optical fibers, circuits, or any suitable media that is fleeting and devoid of any semblance of permanence during transmission, and/or any suitable intangible media.

Figure 33:
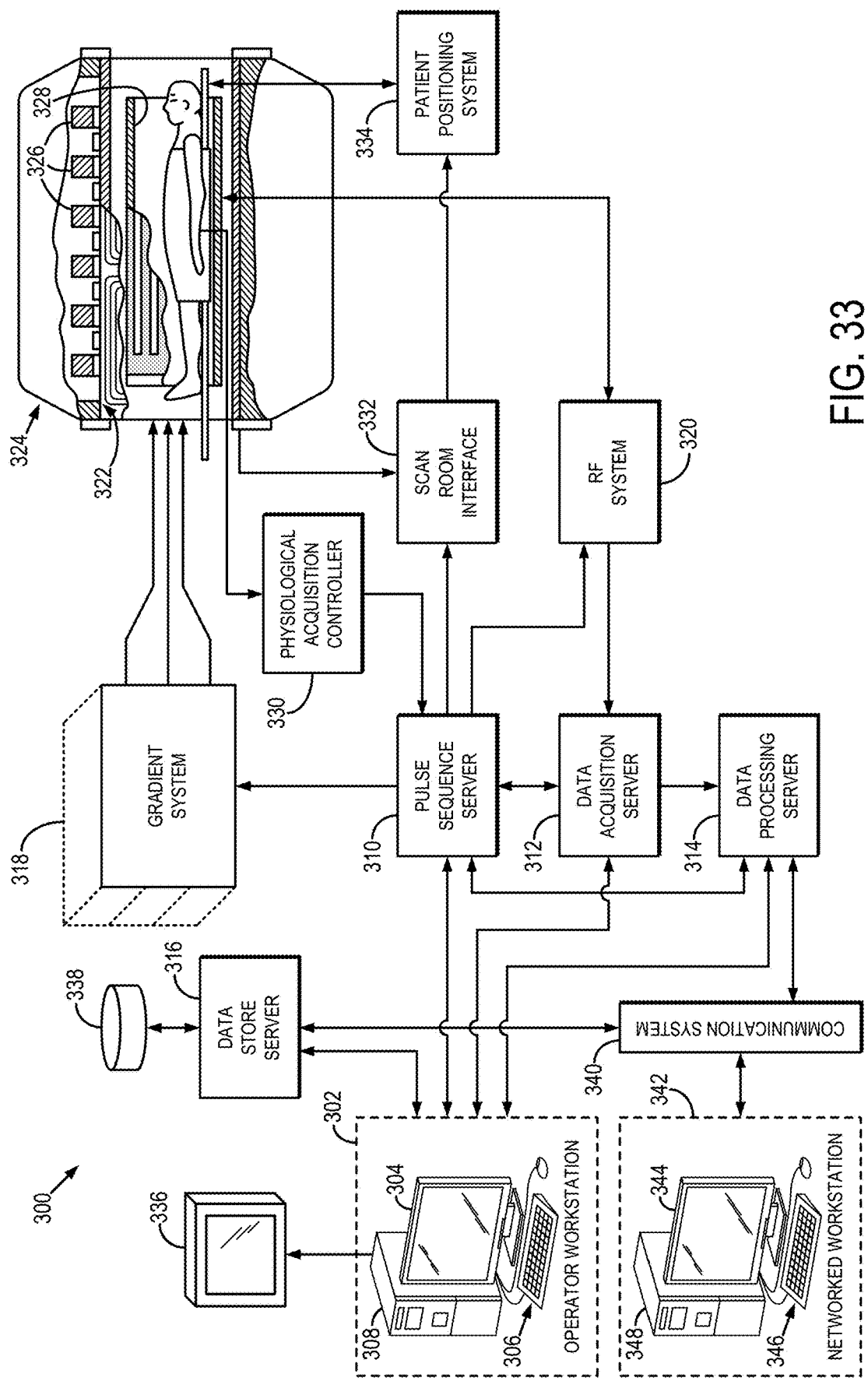
FIG. 33 is a block diagram of an example of a magnetic resonance imaging ("MRI") system.

As noted above, in some implementations, the methods described in the present disclosure can be used to design RF pulses for use in MRI. Referring particularly now to FIG. 33, an example of an MRI system 300 that can implement the methods described here is illustrated. The MRI system 300 includes an operator workstation 302 that may include a display 304, one or more input devices 306 (e.g., a keyboard, a mouse), and a processor 308. The processor 308 may include a commercially available programmable machine running a commercially available operating system. The operator workstation 302 provides an operator interface that facilitates entering scan parameters into the MRI system 300. The operator workstation 302 may be coupled to different servers, including, for example, a pulse sequence server 310, a data acquisition server 312, a data processing server 314, and a data store server 316. The operator workstation 302 and the servers 310, 312, 314, and 316 may be connected via a communication system 340, which may include wired or wireless network connections.

The pulse sequence server 310 functions in response to instructions provided by the operator workstation 302 to operate a gradient system 318 and a radiofrequency ("RF") system 320. Gradient waveforms for performing a prescribed scan are produced and applied to the gradient system 318, which then excites gradient coils in an assembly 322 to produce the magnetic field gradients $G_x$, $G_y$, and $G_z$ that are used for spatially encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil to perform the prescribed magnetic resonance pulse sequence. Responsive magnetic resonance signals detected by the RF coil 328, or a separate local coil, are received by the RF system 320. The responsive magnetic resonance signals may be amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the prescribed scan and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. An RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \tag{9}$$

and the phase of the received magnetic resonance signal may also be determined according to the following relationship:

$$\varphi = \tan^{-1}\left(\frac{Q}{I}\right). \tag{10}$$

The pulse sequence server 310 may receive patient data from a physiological acquisition controller 330. By way of example, the physiological acquisition controller 330 may receive signals from a number of different sensors connected to the patient, including electrocardiograph ("ECG") signals from electrodes, or respiratory signals from a respiratory bellows or other respiratory monitoring devices. These signals may be used by the pulse sequence server 310 to synchronize, or "gate," the performance of the scan with the subject's heart beat or respiration.

The pulse sequence server 310 may also connect to a scan room interface circuit 332 that receives signals from various sensors associated with the condition of the patient and the magnet system. Through the scan room interface circuit 332, a patient positioning system 334 can receive commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, so that data is not lost by data overrun. In some scans, the data acquisition server 312 passes the acquired magnetic resonance data to the data processor server 314. In scans that require information derived from acquired magnetic resonance data to control the further performance of the scan, the data acquisition server 312 may be programmed to produce such information and convey it to the pulse sequence server 310. For example, during pre-scans, magnetic resonance data may be acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also process magnetic resonance signals used to detect the arrival of a contrast agent in a magnetic resonance angiography ("MRA") scan. For example, the data acquisition server 312 may acquire magnetic resonance data and processes it in real-time to produce information that is used to control the scan.

The data processing server 314 receives magnetic resonance data from the data acquisition server 312 and processes the magnetic resonance data in accordance with instructions provided by the operator workstation 302. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 314 are conveyed back to the operator workstation 302 for storage. Real-time images may be stored in a data base memory cache, from which they may be output to operator display 302 or a display 336. Batch mode images or selected real-time images may be stored in a host database on disc storage 338. When such images have been reconstructed and transferred to storage, the data processing server 314 may notify the data store server 316 on the operator workstation 302. The operator workstation 302 may be used by an operator to archive the images, produce films, or send the images via a network to other facilities.

The MRI system 300 may also include one or more networked workstations 342. For example, a networked workstation 342 may include a display 344, one or more input devices 346 (e.g., a keyboard, a mouse), and a processor 348. The networked workstation 342 may be located within the same facility as the operator workstation 302, or in a different facility, such as a different healthcare institution or clinic.

The networked workstation 342 may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a radio frequency (RF) pulse for use in magnetic resonance, the steps of the method comprising:
    (a) providing a computer system, a set of RF input parameters;
    (b) generating an optimal phase surface with the computer system by iteratively updating an initial RF pulse profile based at least in part on the set of RF input parameters, and wherein the optimal phase surface contains different RF pulse profiles for each RF input parameter in the set of RF input parameters; and
    (c) selecting an RF pulse profile from the optimal phase surface with the computer system based on a selection of an RF input parameter in the set of RF input parameters associated with a desired characteristic of the RF pulse profile.

2. The method of claim 1, wherein the set of RF input parameters comprises a set of bandwidth values.

3. The method of claim 2, wherein the set of bandwidth values iteratively extends to a digitization limit of a pulse shape.

4. The method of claim 3, wherein iteratively extending the set of bandwidth values comprises using an iterative optimization to assign an optimal total nutation angle to each bandwidth value in the set of bandwidth values.

5. The method of claim 2, wherein generating the optimal phase surface includes updating the initial RF pulse profile based at least in part on the set of bandwidth values and also on an RF inhomogeneity compensation range.

6. The method of claim 1, wherein the set of RF input parameters comprises a set of values indicating an RF pulse shape.

7. The method of claim 1, wherein the set of RF input parameters comprises a set of values indicating an RF pulse length.

8. The method of claim 1, wherein the set of RF input parameters comprises a set of values associated with a selectivity of each different RF pulse profile.

9. The method of claim 1, wherein the set of RF input parameters comprises a set of values defining a traversal of spin magnetization from a first point on a Bloch sphere to a second point on a Bloch sphere.

10. The method of claim 9, wherein the values defining the traversal of spin magnetization from a first point on a Bloch sphere to a second point on a Bloch sphere include Bloch sphere component vectors.

11. The method of claim 1, wherein generating the optimal phase surface further comprises optimizing the initial RF pulse profile using a numerical optimization algorithm to iteratively update the initial RF pulse profile based at least in part on the set of RF input parameters.

12. The method of claim 11, wherein the numerical optimization algorithm comprises a Broyden-Fletcher-Goldarb-Shanno (BFGS) algorithm.

13. The method of claim 1, wherein generating the optimal phase surface further comprises iteratively updating an RF pulse profile until a corresponding fidelity exceeds a user-defined set point.

14. The method of claim 1, wherein generating the optimal phase surface further comprises validating the optimal phase surface after a number of iterations using an evolutionary algorithm.

15. The method of claim 14, wherein the evolutionary algorithm comprises a genetic algorithm.

16. The method of claim 14, wherein the number of iterations includes at most 100 iterations.

17. The method of claim 1, wherein generating the optimal phase surface further comprises generating each RF pulse profile by incrementing an RF bandwidth and iterating on a nutation angle until a corresponding fidelity for each RF pulse profile exceeds a user-defined set point.

18. The method of claim 1, wherein step (c) includes providing an index file to the computer system and selecting the RF pulse profile includes performing a search over the optimal phase surface based on the RF input parameter using the index file.

19. The method of claim 1, wherein the RF pulse is designed as an ultra-low power RF pulse.

20. The method of claim 1, wherein the RF pulse is designed as a water de-selective excitation RF pulse that de-selects water signals while simultaneously excites both high-field and low-field resonances.

21. The method of claim 1, further comprising providing the selected RF pulse profile to a nuclear magnetic resonance system and generating an RF pulse with the nuclear magnetic resonance system based on the RF pulse profile.

22. The method of claim 21, wherein the nuclear magnetic resonance system is a nuclear magnetic resonance spectroscopy system.

23. The method of claim 21, wherein the nuclear magnetic resonance system is a magnetic resonance imaging (MRI) system.

24. The method of claim 1, wherein the selected RF pulse profile is used to generate a pulse sequence that enables a robust spin entanglement for quantum computing.

25. A method for producing a radio frequency (RF) pulse for use in magnetic resonance, the steps of the method comprising:
  (a) providing a computer system, a set of RF input parameters;
  (b) accessing a neural network that has been trained on training data comprising optimal phase surface data containing different RF pulse profiles for RF input parameters, the neural network having been trained to generate RF pulse profile data based on input RF pulse parameter data;
  (c) selecting from the set of RF input parameters, one or more RF input parameters associated with a desired characteristic of an RF pulse profile; and
  (d) inputting the one or more RF input parameters to the neural network, generating output as the RF pulse profile.

26. The method of claim 25, wherein the one or more RF input parameters comprise one or more of a bandwidth, an RF inhomogeneity compensation, or a nutation angle.

27. A method for producing a radio frequency (RF) pulse for use in a nuclear magnetic resonance system, the steps of the method comprising:
  (a) providing a set of RF input parameters to a computer system;
  (b) generating an optimal phase surface with the computer system by iteratively updating an initial RF pulse profile based at least in part on the set of RF input parameters, and wherein the optimal phase surface contains different RF pulse profiles for each RF input parameter in the set of RF input parameters;
  (c) providing an index file to the computer system, wherein the index file contains an indexing of data in the optimal phase surface;
  (d) selecting an RF pulse profile with the computer system based on a search on the optimal phase surface using the index file;
  (d) providing the selected RF pulse profile to the nuclear magnetic resonance system; and
  (e) generating an RF pulse with the nuclear magnetic resonance system based on the RF pulse profile.

28. The method of claim 27, wherein the search on the optimal phase surface retrieves a shortest pulse profile from the optimal phase surface that also satisfies user input parameters.

29. The method of claim 27, wherein the nuclear magnetic resonance system is a nuclear magnetic resonance spectroscopy system.

30. The method of claim 27, wherein the nuclear magnetic resonance system is a magnetic resonance imaging (MRI) system.

* * * * *